(12) United States Patent
Dai et al.

(10) Patent No.: US 8,236,626 B2
(45) Date of Patent: Aug. 7, 2012

(54) NARROW GRAPHENE NANORIBBONS FROM CARBON NANOTUBES

(75) Inventors: Hongie Dai, Cupertino, CA (US); Liying Jiao, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 174 days.

(21) Appl. No.: 12/760,998

(22) Filed: Apr. 15, 2010

(65) Prior Publication Data

US 2011/0253969 A1    Oct. 20, 2011

(51) Int. Cl.
*H01L 21/335* (2006.01)

(52) U.S. Cl. . 438/142; 438/198; 438/299; 257/E21.051; 257/E29.082; 977/848; 977/882; 977/888; 977/890; 977/936

(58) Field of Classification Search .................. 977/848, 977/882, 888, 890, 936; 257/E21.051, E29.082
See application file for complete search history.

(56) References Cited

U.S. PATENT DOCUMENTS

| | | | |
|---|---|---|---|
| 7,357,906 B2 | 4/2008 | Colbert et al. | |
| 7,416,699 B2 | 8/2008 | Dai et al. | |
| 7,481,989 B2 | 1/2009 | Smalley et al. | |
| 7,655,272 B1 | 2/2010 | Javey et al. | |
| 7,887,888 B1* | 2/2011 | Sidorov et al. | 427/472 |
| 2009/0087493 A1 | 4/2009 | Dai et al. | |
| 2010/0028681 A1 | 2/2010 | Dai et al. | |
| 2010/0098904 A1 | 4/2010 | Dai et al. | |

OTHER PUBLICATIONS

Jiao, et al., "Narrow graphene nanoribbons from carbon nanotubes", Nature, vol. 458, Apr. 16, 2009, pp. 877-880.
Sun, et al., "Soluble Graphene Through Edge-Selective Functionalization", Nano Res (Feb. 2010) 3: 117-125.
Eilias, et al., "Longitudinal Cutting of Pure and Doped Carbon Nanotubes to form Graphitic Nanoribbons Using Metal Clusters as Nanoscalpels", American Chemical Society, Aug. 19, 2009, pp. A-F.
Li, et al., "Chemically Derived, Ultrasmooth Graphene Nanoribbon Semiconductors", Science, vol. 319, Feb. 29, 2008, pp. 1229-1232.
Mauricio Terrones, "Nanotubes Unzipped", Nature, vol. 458, Apr. 16, 2009, pp. 845-846.
Zhang, et al., "Graphene Nanoribbon Tunnel Transistors", IEEE Electron Device Letters, 2008, pp. 1-3.
Jiao, et al., "Facile synthesis of high-quality graphene nanoribbons", Nature Nano., 5:321-325 (Apr. 4, 2010).

* cited by examiner

*Primary Examiner* — Evan Pert
(74) *Attorney, Agent, or Firm* — David J. Aston; Peters Verny, LLP

(57) ABSTRACT

Disclosed is a method for making graphene nanoribbons (GNRs) by controlled unzipping of structures such as carbon nanotubes (CNTs) by etching (e.g., argon plasma etching) of nanotubes partly embedded in a polymer film. The GNRs have smooth edges and a narrow width distribution (2-20 nm). Raman spectroscopy and electrical transport measurements reveal the high quality of the GNRs. Such a method of unzipping CNTs with well-defined structures in an array will allow the production of GNRs with controlled widths, edge structures, placement and alignment in a scalable fashion for device integration. GNRs may be formed from nanostructures in a controlled array to form arrays of parallel or overlapping structures. Also disclosed is a method in which the CNTs are in a predetermined pattern that is carried over and transferred to a substrate for forming into a semiconductor device.

24 Claims, 23 Drawing Sheets

Figure 15A
Figure 15B
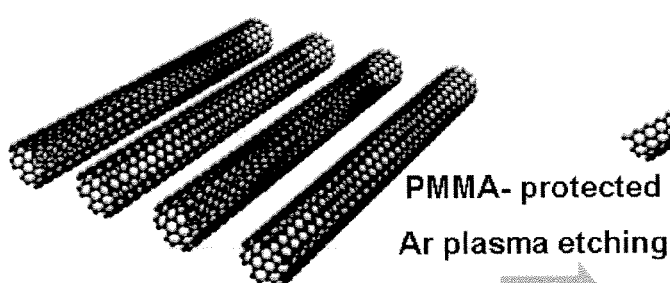
(a) CNT array
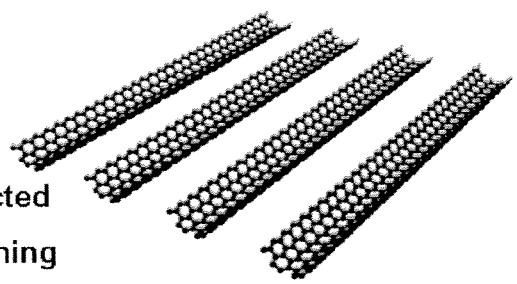
(b) GNR array
PMMA-protected Ar plasma etching
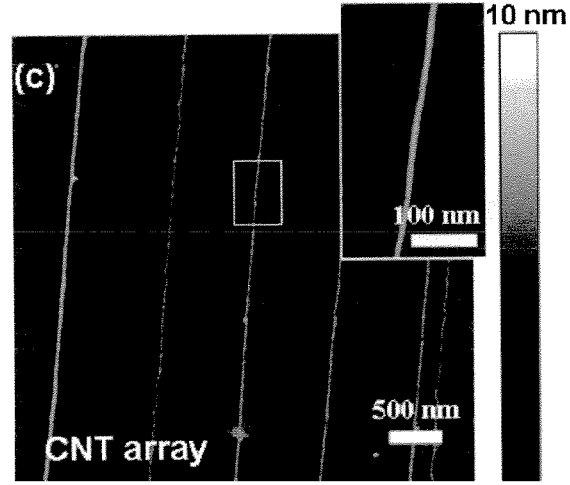
(c) CNT array
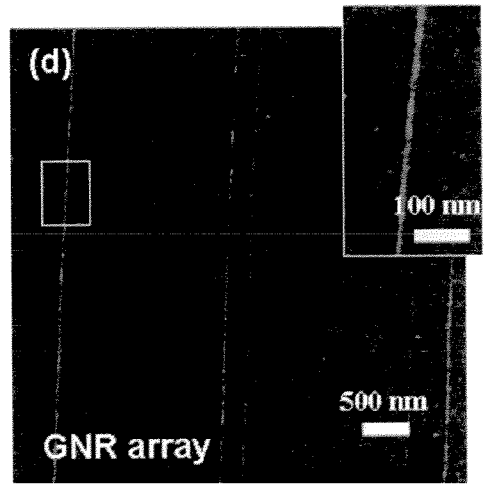
(d) GNR array
Figure 15C
Figure 15D Figure 17A
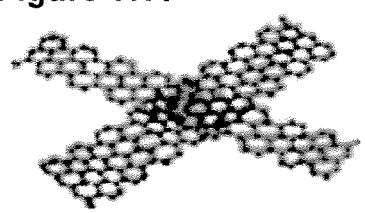
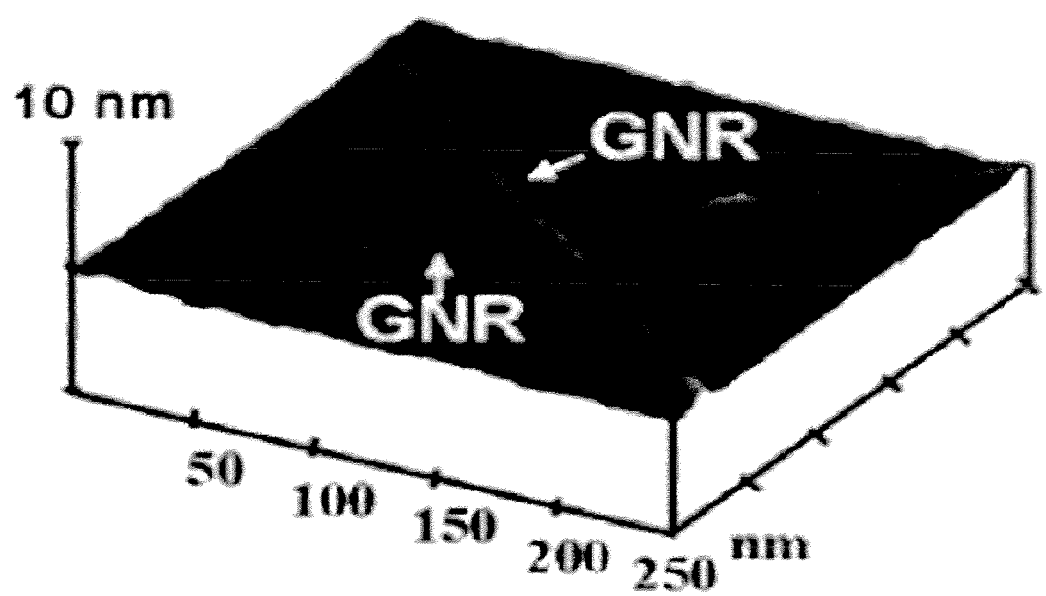
Figure 17B Figure 18A
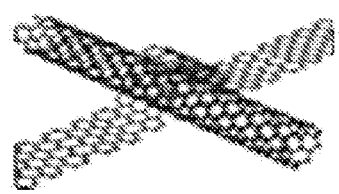
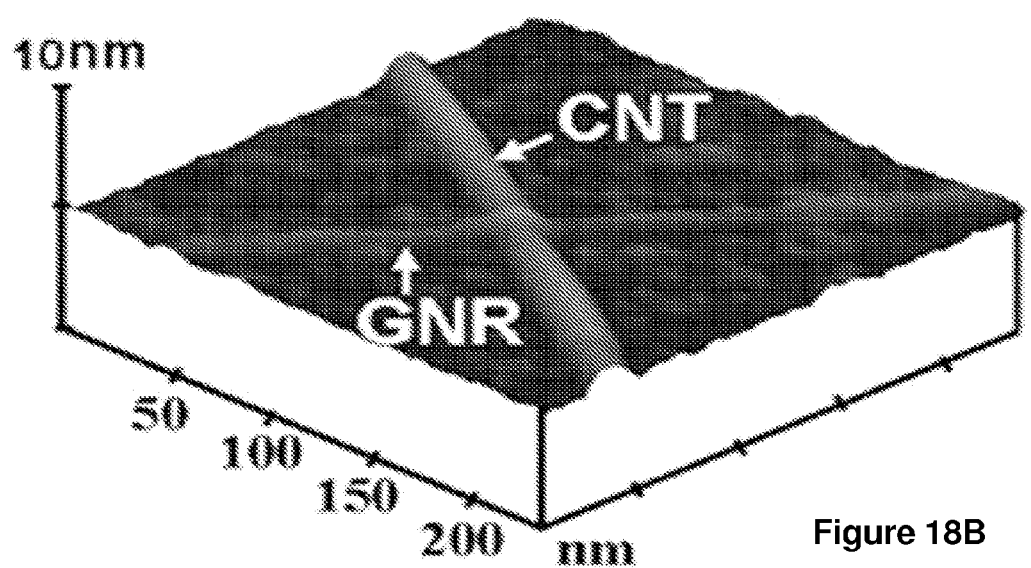
Figure 18B

NARROW GRAPHENE NANORIBBONS FROM CARBON NANOTUBES

STATEMENT OF GOVERNMENTAL SUPPORT

This invention was made with Government support under contract N00014-08-1-0860 awarded by the United States Office of Naval Research and under contract HR0011-07-03-0002 awarded by the Defense Advanced Research Projects Agency. The Government has certain rights in this invention.

CROSS-REFERENCE TO RELATED APPLICATIONS

None

REFERENCE TO SEQUENCE LISTING, COMPUTER PROGRAM, OR COMPACT DISK

None.

BACKGROUND OF THE INVENTION

1. Field of the Invention

The present invention relates to the field of materials and particularly to the field of graphene nanoribbons.

2. Related Art

Presented below is background information on certain aspects of the present invention as they may relate to technical features referred to in the detailed description, but not necessarily described in detail. The discussion below should not be construed as an admission as to the relevance of the information to the claimed invention or the prior art effect of the material described.

Graphene nanoribbons (GNRs) are materials with properties distinct from those of other carbon allotropes, as described in detail by Li et al 2008 *Science* 319: 1229; Wang et al 2008 *Phys. Rev. Lett.* 100: 206803; Chen et al 2007 *Physica E* 40: 228; Han et al 2007 *Phys. Rev. Lett.* 98: 206805; and Cresti et al 2008 *Nano Res.* 1: 361. The high carrier mobility of graphene has been described in detail by Novoselov et al 2004 *Science* 306: 666; Zhang et al 2005 *Nature* 438: 201; Novoselov et al 2005 *Nature* 438: 197; Berger et al 2006 *Science* 312: 1191; and Geim & Novoselov 2007 *Natur. Mater.* 6: 183. This offers the possibility of building high-performance graphene-based electronics. The all-semiconducting nature of sub-10-nm GNRs could bypass the problem of extreme chirality dependence of the metal or semiconductor nature of carbon nanotubes (CNTs) in future electronics. Recently, both theoretical and experimental work has shown that quantum confinement and edge effects introduce a band gap in narrow graphene ribbons independent of chirality, and the resulting GNR semiconductors can be used to make field-effect transistors (Nakada et al 1996 *Phys. Rev. B* 54:17954; Barone et al 2006 *Nano Lett.* 6: 2748; Son et al 2006 *Phys. Rev. Lett.* 97: 216803; Yang et al 2007 *Phys. Rev. Lett.* 99:186801; Li et al 2008 *Science* 319: 1229; Wang et al 2008 *Phys. Rev. Lett.* 100: 206803; Chen et al 2007 *Physica E* 40: 228; and Han et al 2007 *Phys. Rev. Lett.* 98: 206805).

Currently, making pristine GNRs using lithographic, chemical or sonochemical methods is challenging. Lithographic (Chen et al 2007, *Physica. E* 40: 228; Han et al 2007, *Phys. Rev. Lett.* 98: 206805; Tapaszto et al 2008 *Nat. Nanotechnol.* 3: 397), chemical (Datta et al 2008, *Nano Lett.* 8: 1912; Ci et al 2008, *Nano Res.* 1: 116; Campos et al 2009, *Nano Lett.* 9: 2600; Campos-Delgado et al 2008, *Nano Lett.* 8: 2773) and sonochemical (Li et al 2008, *Science* 319: 1229) methods have been developed to make GNRs. Lithographic patterning has been used to produce wide ribbons (>20 nm) from graphene sheets (Chen et al 2007 *Physica E* 40: 228; and Han et al 2007 *Phys. Rev. Lett.* 98: 206805), but the width and smoothness of the GNRs were limited by the resolution of the lithography and etching techniques. Bulk amounts of wide (20-300 nm) and few-layered (2-40) GNRs were synthesized by a chemical vapor deposition method (Campos-Delgado et al 2008 *Nano Lett.* 8:2773). Recently, GNR formation by unzipping carbon nanotubes (CNTs) has been reported (as described below). Two groups successfully unzipped multiwalled carbon nanotubes (MWNTs) in solution-phase by using potassium permanganate oxidation (Kosynkin et al 2009 *Nature* 458: 872) and lithium and ammonia reactions (Cano-Marquez et al 2009, *Nano Lett.* 9: 1527), respectively. Only wide, heavily oxidized and defective GNRs were made due to extensive oxidation involved in the unzipping process. More recently, unzipping methods such as catalytic cutting (Elias et al 2009, *Nano Lett.* ASAP DOI: 10.1021/n1901631z) and high current pulse burning (Kim et al 2009, *Appl. Phys. Lett.* 95: 083103) have been reported, but the quality and yield of GNRs were unknown. Thus far, it has been difficult to obtain GNRs with smooth edges and controllable widths at high yields.

CNTs are considered to be GNRs rolled up into seamless tubes and the synthesis, size control, placement and alignment control of nanotubes have been widely investigated, and established (Dai 2002 *Surf. Sci.* 500:218; and Jorio et al 2008 in Carbon Nanotubes: Advanced Topics in the Synthesis, Structure, Properties and Applications—Springer). The invention described below relates to a discovery that, CNTs can be unzipped to form GNRs with structural control. One great challenge in converting CNTs to GNRs is to develop ways of cleaving CNTs in the longitudinal direction without rapid etching along the circumference.

SPECIFIC PATENTS AND PUBLICATIONS

Kosynkin et al., "Longitudinal unzipping of carbon nanotubes to form graphene nanoribbons," *Nature* 458: 872-876 (2009) describes making graphene sheets and ribbons from multiwalled nanotubes by concentrated sulphuric acid treatment followed by potassium permanganate at room temperature and finally heating them at 55-70° C. This technique works well with nanotubes that have many structural defects on their surfaces (such as those made by chemical vapor deposition). But it is less effective with more crystalline nanotubes produced by other methods such as laser ablation or arc discharge.

Zhang et al., "Transforming carbon nanotube devices into carbon nanoribbon devices," *J. Am. Chem. Soc.* 131: 13460-13463 (2009) discloses an extension of the nanotube longitudinal unzipping process to convert electrode-bound multiwalled carbon nanotube (MWNT) devices into graphene nanoribbon devices.

Cano-Marquez et al., "Graphene sheets and ribbons produced by lithium intercalation and exfoliation of carbon nanotubes," *Nano Lett.* 9: 1527-1533 (2009) describes a method for unzipping multiwalled carbon nanotubes in which alkali-metal atoms intercalate between the concentric cylinders of the nanotubes. The atoms are then washed out, which causes the tubes to open along their axes.

Kim et al., "Fabrication of graphene layers from multi-walled carbon nanotubes using high dc pulse," *Appl. Phys. Lett.* 95: 083103 (2009) discloses the fabrication of graphene layers from multiwalled carbon nanotubes (MWNTs) with a high direct current pulse through a pulsed current sintering process.

Elias et al., "Longitudinal cutting of pure and doped carbon nanotubes to form graphitic nanoribbons using metal clusters as nanoscalpels," *Nano Lett.* ASAP DOI 10.1021/n1901631z (2009) describes the use of transition metal nanoparticles (Ni or Co) to longitudinally cut open multiwalled carbon nanotubes to create graphitic nanoribbons.

Park et al., "Chemical Methods for the production of graphenes," *Nature Nanotechnology,* 4:2-17-224 (2009) discloses that graphene has been made by various methods, including chemical vapor deposition (CVD) and epitaxial growth, such as the decomposition of ethylene on nickel surfaces.

Li et al. "Chemically Derived, Ultrasmooth Graphene Nanoribbon Semiconductors," *Science,* 319:1229-1232 (2008) describes the production of nanoribbons using exfoliated graphite dispersed into 1,2-dichloroethane (DCE) solution. This method does not disclose the use of intercalation, and the use for solubilization of PmPV (poly (m-phenylenevinylene-co-2,5-dioctyloxy-p-phenylenevinylene) dispersant. Described there, by authors including the present inventors, is a chemical route to produce graphene nanoribbons (GNR) with width below 10 nanometers, as well as single ribbons with varying widths along their lengths or containing lattice-defined graphene junctions for potential molecular electronics. The GNRs were solution-phase derived, stably suspended in solvents with non-covalent polymer functionalization, and exhibited ultra-smooth edges with possibly well-defined zig-zag or armchair edge structures. Electrical transport experiments showed that unlike single-walled carbon nanotubes, all of the sub-10 nanometer GNRs produced were semiconductors and afforded graphene field effect transistors (FET) with on-off ratios ~107 at room temperature. However, the yield of GNRs was low and their width distribution was broad; widths ranged from less than 10 nm to ~100 nm.

As will be described below, the GNRs of the present method are made for the first time by controlled unzipping of multiwalled carbon nanotubes by plasma etching of nanotubes partly embedded in a polymer film.

BRIEF SUMMARY OF THE INVENTION

The following brief summary is not intended to include all features and aspects of the present invention, nor does it imply that the invention must include all features and aspects discussed in this summary.

The present invention comprises, in general, the preparation of highly conducting, pristine graphene nanoribbons (GNR). The present GNR are prepared by controlled etching of partially embedded multiwalled carbon nanostructures (MWCNS), where the embedding layer protects the MWCNS from the etchant. The GNR so produced are essentially pristine, and have smooth edges and a narrow width distribution (10-20 nm). Raman spectroscopy and electrical transport measurements described below reveal the high quality of obtained GNRs. Also disclosed is a method of making graphene nanoribbons (GNRs) by controlled unzipping of carbon nanotubes (CNTs) comprising the steps of: depositing a dispersed CNT suspension over a substrate where nanotubes are deposited as individual (unclustered) CNTs; layering a film of polymer over said deposited CNTs so that CNTs are embedded in said polymer; peeling off polymer-CNTs film; and exposing said film to an etchant, such as a plasma. Etching is carried out under controlled conditions, depending on particular etching components. For example, etching may be carried out at $t1$, $t2$ and so on to $tn$, wherein $tn > \ldots > t2 > t1$, to form GNRs with controlled number of layers, width and edge structure. The etchant is non-oxidizing and preferably is a noble gas plasma, such as argon, which is essentially inert towards graphitic carbon.

In one aspect of the invention, single-, bi- and multi-layer GNRs are formed depending upon the degree of etching, which can be controlled by exposure time to the plasma, designated as times $t1$ to $tn$. In another aspect, GNRs of a width ranging from 10-20 nm are obtained by the present method. In another aspect, the obtained GNRs have smooth edges and are essentially pristine, as shown by a Raman spectroscopic ID/IG ratio of <0.4.

In certain aspects, the present invention comprises a method for producing a graphene nanoribbon by opening a closed carbon nanostructure, ("CNS") comprising the steps of: depositing a CNS onto a first substrate; applying a protective coating to cover the CNS on the first substrate; obtaining an exposed strip essentially free of protective coating; treating said exposed strip to remove outer wall bonds in said exposed strip to produce an etched CNS; and recovering the etched CNS from the protective coating to produce the graphene nanoribbon. In one aspect, the present invention comprises a method in which the step of obtaining an exposed strip comprises separating the CNS from the substrate. For example, as shown in FIG. 1A, step 12, a coated CNS may be "peeled off" of the substrate, leaving the substrate-contacting portion exposed. That is, in certain aspects, the present method comprises removing the CNS, along with the protective coating, from the first substrate and applying it to a second substrate prior to said treating.

In certain aspects of the present invention the CNS is selected from the group consisting of MWNT (multiwalled nanotubes, e.g., multiwalled carbon nanotubes, including few walled carbon nanotubes), SWNT (single walled nanotubes, e.g., single walled carbon nanotubes), spherical fullerenes (e.g., "Buckyballs"), carbon nano-onions, carbon nanohorns, carbon helicoidal tubes, and carbon toroidal structures.

In certain aspects, the present invention comprises methods for producing few-layered GNRs, e.g., between one and four layers, or between two and twenty layers, etc. In certain aspects, the present invention comprises the making of a graphene nanoribbon that has ultrasmooth edges, as described herein. In certain aspects, the present invention comprises a method wherein the produced graphene nanoribbon has a width between about 10 nm and 20 nm, or the GNR may be narrower, e.g., 2-10 nm, or 2-10 nm.

In certain aspects, the present invention comprises a method wherein depositing a CNS onto a substrate comprises applying a dispersed mixture of CNS onto a substrate. That is, a dispersed mixture is applied to the substrate so that individual CNS may be coated and further treated as described. There may be any number of CNSs treated in parallel. In certain aspects, the present invention comprises a method wherein a protective coating applied to the CNS to prevent etching is a polymer. In certain aspects, the polymer may adhere to, or be in close proximity to the CNS. The polymer may be an acrylate selected from the group consisting of polyacrylamides, polycarbonates, silicone, or co- and terpolymers of acrylates. In certain aspects, the present invention comprises use of a coating material comprising poly (methyl methacrylate).

In certain aspects, the present invention comprises a method wherein said treating said exposed strip comprises contacting the exposed strip with plasma. The plasma may be argon plasma. The plasma may be a low power plasma. In certain aspects, the present invention comprises a method involving treating the exposed strip for longer times (e.g., with the plasma) to produce fewer layer graphene nanoribbons, e.g., by more etching.

In certain aspects, the present invention comprises a method comprising the steps of forming a GNR as described above, and further comprising the step of applying a recovered graphene nanoribbon to an electronic device. The GNR will be an active component of the electronic device. It may be part of an FET. It may be fabricated by a process involving the step of applying the recovered graphene nanoribbon to lengthwise on a gate material between a source electrode at one end portion and a drain electrode at an opposite end portion. In yet other aspects of the invention the resistivity of the graphene nanoribbon is between about 10 and 40 k$\Omega$, or between, e.g., 10 and 20 k$\Omega$, 20 and 30 k$\Omega$, etc.

In certain aspects, the present invention comprises a method of preparing a graphene nanoribbon array, comprising the steps of: depositing a plurality of closed graphene nanostructures (hereinafter "CNSs") onto a first substrate in a predetermined pattern; applying a protective coating to cover the plurality of CNSs on the first substrate; separating the CNSs from the substrate leaving an exposed strip essentially free of protective coating and the CNSs embedded in said protective coating in said predetermined pattern; treating, optionally on a second substrate, said exposed strip to remove outer wall bonds in said exposed strip to produce etched CNSs embedded in said protective coating in said predetermined pattern; and transferring said etched CNSs embedded in said protective coating in said predetermined pattern to a third substrate in graphene nanoribbon array. This method may further comprise the step of forming an electronic device on said third substrate. In certain aspects of this embodiment of the invention, features and steps outlined above as additional aspects of the invention may also be employed. For example, the CNS used may be selected from the group consisting of SWNT and MWNT. In certain aspects, this embodiment of the present invention comprises a method wherein said third substrate comprises a plurality of silicon back gates, one silicon backgate in contact with one graphene nanoribbon.

In certain aspects, the present invention comprises materials and devices formed by the present methods. For example, the invention may comprise a semiconductor device having a number of transistors thereon, each transistor having a gate, drain and source terminal, wherein the transistors comprise a graphene nanoribbon connecting the source and drain terminals.

BRIEF DESCRIPTION OF THE DRAWINGS

FIG. 2A shows an AFM image of raw MWNTs dispersed on a Si substrate.

FIG. 3A is a graph of diameter distribution of starting pristine MWNTs. FIGS. 3B and 3C are histograms of width and height distributions respectively, of GNRs generated by unzipping the MWNTs.

FIG. 4A is an AFM image of a GNR; FIG. 4B is a G-band Raman image and FIG. 4C is the Raman spectrum of a single-layer GNR. Inset of FIG. 4C is a 2D-band spectrum of the GNR and a single-Lorentzian fit, although the lines are essentially superimposed so as to be indistinguishable a.u., arbitrary units.

FIG. 9A is a Raman spectrum of a MWNT without 2D-band.

FIG. 12A is a diagram of a GNR device. S, source; D, drain. FIG. 12B is a plot of drain-source current ($I_{ds}$) versus gate-source voltage ($V_{gs}$) for a ~16-nm-wide GNR device probed in vacuum after electrical annealing. The Dirac point is near $V_g$=0 V. Inset, AFM image of the aforementioned device; scale bar, 200 nm. FIG. 12C is a graph showing $I_{ds}$-$V_{gs}$ curves for a ~7-nm-wide GNR device at various biases probed in air (an AFM image, not shown was also obtained. The ratio of on-state current ($I_{on}$) to off-state current ($I_{off}$) for this GNR device is ~10. FIG. 12D is a graph showing various $I_{ds}$-$V_{ds}$ curves for the device in FIG. 12C at gate biases $V_{gs}$ ranging from −40V (bottom) to 40V (top) in steps of 10 V.

FIG. 15A-D is a series of images depicting the formation of a GNR array from a CNT (carbon nanotube) array. FIG. 15A shows a schematic of a CNT array; FIG. 15B shows a schematic of a resultant GNR array; FIG. 15C is an AFM image of the CNT array; FIG. 15D is an AFM image of the GNR array.

FIG. 16A is an AFM image of AFM images of GNRs with different widths. FIG. 16A, 8 nm; FIG. 16B, 4 nm; and FIG. 16C, 2 nm. FIG. 16D is an image of a combination CNT and GNR, as drawn in FIG. 16E.

FIG. 17A-B is a representation of GNR crossbars. FIG. 17A is a schematic of the cross bar, and FIG. 17B is an AFM image. The widths of both cross bars was about 5 nm.

FIG. 18A-B is a representation of a GNR-CNT cross bar. The ~6 nm wide GNR was on top of the CNT with a diameter of ~3.3 nm. The height of the CNT near the cross point decreased to 3.0 nm due to the radial deformation introduced by the GNR. FIG. 18A is a drawing and FIG. 18B is an AFM image.

DETAILED DESCRIPTION OF THE PREFERRED EMBODIMENT

Overview

Definitions

Figure 1A:
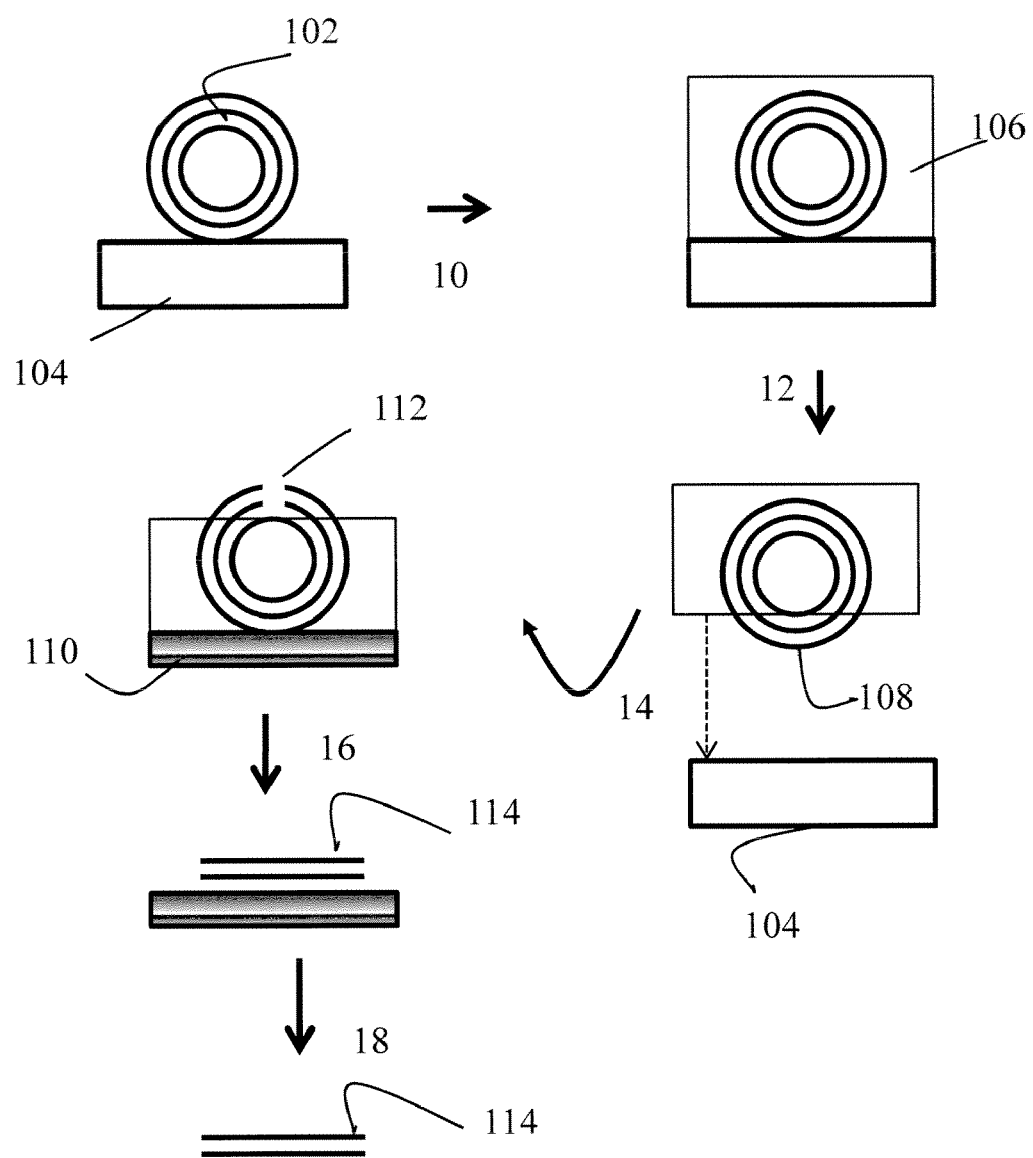
FIG. 1A and FIG. 1B are schematic drawing of a simplified (FIG. 1A) and a detailed (FIG. 1B) description of the presently exemplified process of making GNRs from MWCNTs.

Unless defined otherwise, all technical and scientific terms used herein have the same meaning as commonly understood by those of ordinary skill in the art to which this invention belongs. Although any methods and materials similar or equivalent to those described herein can be used in the practice or testing of the present invention, the preferred methods and materials are described. Generally, nomenclatures utilized in connection with, and techniques of, physics and chemistry are those well known and commonly used in the art. Certain experimental techniques, not specifically defined, are generally performed according to conventional methods well known in the art and as described in various general and more specific references that are cited and discussed throughout the present specification. For purposes of the clarity, following terms are defined below.

The term "about" is used in its ordinary sense and is based herein on approximations brought about by measurement error, or insignificant variations beyond the stated range. Where the meaning is not reasonably clear to one skilled in the art from the context, it may be considered to be a variation of not more than plus or minus 10% of a stated numerical value.

The term "atomically smooth edge" or "ultra-smooth edge," as is known in the art, means that the edges of a layer of graphene material are not substantially chemically modified, and, more importantly, extend along a line of intact aromatic rings.

The term "graphene material" means a material which comprises one or more one-atom-thick planar sheets of $sp^2$-bonded carbon atoms that are densely packed in a honeycomb crystal lattice, and, further, contains an intact ring structure of carbon atoms and aromatic bonds throughout at least a majority of the interior sheet and lacks significant oxidation modification of the carbon atoms. The graphene material may contain non-carbon atoms at its edges, such as OH and COOH functionalities. Preferably at least 90% of the interior aromatic bonds are intact. The present pristine graphene material is distinguishable from graphene oxide in that it has a lower degree of oxygen containing groups such as OH, COOH and epoxide. The present graphene material may include sheets and graphene ribbons, the two being distinguishable by size, with a ribbon typically having a relatively narrow width, which can be as low as about 10 nm. Graphene nanoribbons are thin strips of graphene or unrolled single-walled carbon nanotubes. The graphene ribbons were originally introduced as a theoretical model by M. Fujita et al. to examine the edge and nanoscale size effect in graphene. Their electronic states largely depend on the edge structures (armchair or zigzag). The graphene ribbons have a width of not more than about 100 nm.

The term "plasma" is used in its accepted sense to refer to a substance where many of the atoms or molecules are effectively ionized, allowing charges to flow freely. This collection of charged particles containing about equal numbers of positive ions and electrons exhibits some properties of a gas but differ from a gas in being a good conductor of electricity and in being affected by a magnetic field. With the addition of heat or other energy, a significant number of atoms release some or all of their electrons. This leaves the remaining parts of those atoms with a positive charge, and the detached negative electrons are free to move about. These atoms and the resulting electrically charged gas are said to be "ionized." When enough atoms are ionized to a point that significantly affects the electrical characteristics of the gas, it is a plasma. Plasmas can carry electrical currents and generate magnetic fields and the most common method for producing a plasma is by applying an electric field to a gas in order to accelerate the free electrons. Processes like Corona Treatment, Gas Atmosphere Plasma, Flame Plasma, Atmospheric Plasma, Low Pressure Plasma, Vacuum Plasma, Glow-discharge Plasma, and Plasma Etching all rely on the properties of plasma.

The term "pristine graphene material" means a graphene material having no significant density of oxygen containing groups or other non-carbon atoms in the plane of the graphene, and very few broken bonds or missing atoms. Also, preferably, they will contain few non-six membered rings and/or non-aromatic rings.

The term "pristine" means free of significant defects and chemical modifications within the plane of the structures, such as oxidation. The term "pristine" is used in its accepted meaning in the art (see, e.g., *Carbon* 45 (2007) 1558-1565).

The term "calcination" (also referred to as calcining) means a thermal treatment process applied to ores and other solid materials in order to bring about a thermal decomposition, phase transition, removal of a volatile fraction or oxidation. The calcination process normally takes place at temperatures below the melting point of the product materials. Calcination is carried out in furnaces or reactors (sometimes referred to as kilns) of various designs including shaft furnaces, rotary kilns, multiple hearth furnaces, and fluidized bed reactors.

The term "closed carbon nanostructure" (or "CNS") means a carbon graphitic particle that is formed into a closed shape, i.e., a carbon nanotube tube, sphere (e.g., "Buckyball"), cone or the like having joined edges forming a continuous surface that can be opened up to form a planar graphene sheet, such as a graphene nanoribbon. Closed carbon nanostructures as defined here include a single walled carbon nanotube (SWNT), a multiwalled carbon nanotube (MWNT), the family of fullerenes C36, C70, C76, etc. [Dorset D. L., Fryer J. R., *J. Phys. Chem. B* 105 2356 (2000], C84 [Kuzuo R. et al., *Phys. Rev. B* 49 5054 (1994)], C60 in a crystalline form, carbon nanocones [Ge M. And Sattler K., *Chem. Phys. Lett.* 220 192 (1994)], carbon nanohorns [Ijima S, *Nature* (London) 354 56 (1990], nanoscale carbon toroidal structures [Itoh S. et al., *Phys. Rev B* 47 1703 (1993)] and helicoidal tubes [Amelinckx S. et al., *Science* 265 635 (1994)].

The graphene material may be characterized as comprising "few layers," meaning between one and fourteen layers, preferably between one and three layers, typically between one and three layers (bi-layer and tri-layer).

General Description of Methods and Materials

Described below are methods involving selective etching of a longitudinal strip of a closed carbon nanostructure, so that at least one outer wall of the closed carbon nanostructure is opened up to form a sheet, or, preferably a ribbon having a width much narrower than a length. The selective etching may be plasma etching, and the closed carbon nanostructures may be multiwalled carbon nanotubes (MWNTs) embedded as individual tubes in a polymer film for controlled unzipping of the nanotubes; this will produce pristine few-layer graphene nanoribbons (GNRs). The GNRs have smooth edges and a narrow width distribution (10-20 nm). Raman spectroscopy and electrical transport measurements reveal the high quality of the GNRs. Unzipping CNTs with well-defined structures in an array allows for the production of GNRs with controlled widths, edge structures, placement and alignment in a scalable fashion for device integration. The high-yield synthesis of pristine GNRs enables facile fabrication of GNR devices, making these materials easily accessible for a wide range of fundamental and practical applications.

Referring now to the process diagrammatically illustrated in FIG. 1A, a multiwalled carbon nanotube or other closed carbon nanostructure (CNS, or MWCNS, multiwalled carbon nanostructure) 102 is placed on a substrate 104 as an isolated object, i.e., not clustered or clumped with other materials, but, preferably in a large number of dispersed CNS. The process in FIG. 1A is outlined in successive steps by arrows 10, 12, 14, 16 and 18, showing illustrative successive steps in the process for clarity. A protective coating 106 is applied to the MWCNS 102 on substrate 104, and essentially completely covers the MWCNS. The protective coating 106 is then removed, in step 12, taking the MWCNS 102 with it, and placed on a second substrate 110, as shown at step 14; however a top portion of the MWCNS is exposed from the protective coating at the surface of the MWCNS that was in contact with the substrate 104. Arrow 14 shows that the MWCNS-protective coating combination is inverted; this is merely for convenience and purposes of illustration. As shown at 112, an exposed portion of the MWCNS is etched longitudinally, severing one or more outer walls of the MWCNS. Next, as shown at arrow 15, the coating 106 is removed, leaving GNR 114 on the substrate 110. Finally, as shown at the step of arrow 18, the GNR 114 may be removed from substrate 110 and utilized in various applications.

Figure 1B:
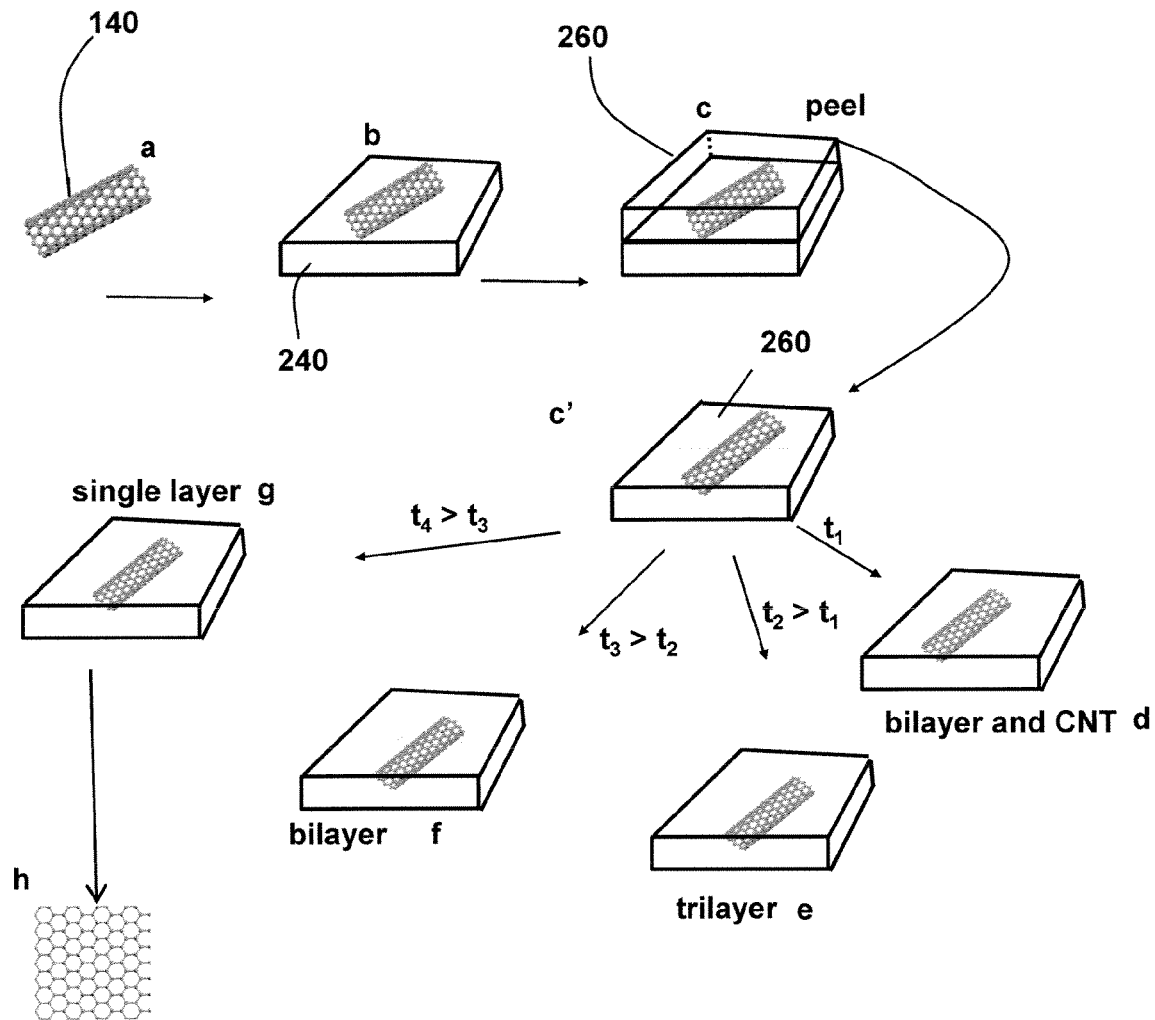

By way of further illustration, FIG. 1B shows an MWNT 140 in step (a). A pristine MWNT is used as the starting raw material. As shown in step b, the MWNT is deposited on a Si substrate 240 and then coated with a PMMA film 260 step c. As shown at step c', the PMMA-MWNT film is peeled from the Si substrate, turned over and then exposed to argon plasma, with part of the MWNT buried in the PMMA film. Although not illustrated as such, the MWNT may be substantially buried, leaving exposed only a narrow longitudinal strip of outer layers. As shown at d-g, several possible products are generated after etching with argon plasma for different times: GNRs with CNT cores are obtained after etching for a short time $t_1$ (d); tri-, bi- and single-layer GNRs are produced after etching for times $t_2$, $t_3$ and $t_4$, respectively ($t_4 > t_3 > t_2 > t_1$; e (trilayer), f (bilayer), and g (single layer). That is, longer etching times produce fewer layered GNRs. As shown at h, PMMA is removed to release the GNR (1, 2 or 3 layer, etc.) from the PMMA. In summary, step d shows resulting bilayer GNR and CNT; step e shows trilayer GNR; step f shows bilayer GNR; and step g shows single layer GNR. Although not shown schematically, d-g all yield GNR as shown at h.

Starting Materials

The starting material in the exemplified embodiment, pristine MWNTs synthesized by arc discharge such as Bucky tube from Aldrich are used. The MWNTS used were about 4-18 nm. As is known, MWNTs have very high aspect ratios (length to diameter), up to over 1 million. They may have anywhere from two to about 50 or more walls.

Other starting materials may be MWNTs from other sources, so long as they are relatively pristine, in order to result in pristine GNRs. MWNTs may be produced by electric arc discharge, laser ablation and chemical vapor deposition. The arc discharge technique involves the generation of an electric arc between two graphite electrodes, one of which is usually filled with a catalyst metal powder (e.g., iron, nickel, cobalt), in a helium atmosphere. The laser ablation method uses a laser to evaporate a graphite target, which is usually filled with a catalyst metal powder too. The arc discharge and laser ablation techniques tend to produce an ensemble of carbonaceous material, which contain nanotubes (30-70%), amorphous carbon and carbon particles (usually closed-caged ones). Other multiwalled carbon nanostructures may be used as starting materials, such as multiwalled carbon nanoonions, multi-walled carbon nanoloops. Alternatively, single walled carbon nanostructures (SWNTs and bucky-balls) may be used to prepare single layer GNRs.

Other closed carbon nanostructures may be used as starting materials, provided that they may be prepared in pristine form and opened up to form sheets, particularly planar sheets of graphene.

Application of CNS to Substrate

In the exemplified process, initially, pristine MWNTs were dispersed in a low concentration surfactant solution by brief sonication. This prevents clumping or clustering so that individual MWNTs can be treated. The surfactant solution used to disperse the MWNTs may be 1% solution of a surfactant like Tween 20 (polysorbate). The closed carbon nanostructures may be dispersed in a wide variety of solvents, e.g., 1-2, dichloroethane, ethanol, toluene, methanol, isopropanol, ethanol, acetone, chloroform, dichlorobenzene, water, etc., or combinations thereof, which minimizes bundling of the nanotubes.

The MWNT suspension is deposited on a substrate where individual tubes are on the surface and can be acted upon. In the examples, the suspension was deposited onto a Si substrate. The Si substrate may be pretreated with a silane. An example of a silane is 3-aminopropyltriethoxysilane (APTES). The surfactant may be removed by calcining the sample at high temperature such as 350° C. The substrate need only be relatively structurally rigid, inert, and impermeable to the etchant. The dispersant should be on-oxidative. By "in solution" it is meant that the nanotubes are either dissolved or suitably dispersed in the solvent. Any method known in the art can be used to dissolve or disperse the nanotubes. Any solvent or mixture of solvents can be used provided that it is inert to all reagents and products.

Application of Protective Coating

A thin film of polymer is applied by any suitable means, e.g., spin-coated on top of the MWNTs (FIG. 1B). The film may be as thin as 300 nm. Embedding MWNTs in a polymer film as an etching mask is essential to protect parts of the shells of the MWNTs from plasma. In the exemplified embodiment, the polymer was poly (methyl methacrylate) (PMMA). The relatively low viscosity and good wetting capability of PMMA allows for its conformal coating on the MWNTs. The film-coated substrate containing the MWNTs is then baked. In one embodiment, it is baked at 170° C. for 2 hours.

A variety of protective coatings may be used on the nanotube or structure to be formed into the GNR. Generally, any polymer which coats the carbon nanostructure, is impermeable to the etchant and can be removed may be employed here. Polymers are presently preferred, as these can provide coatings that are impermeable to and non-removable by the etchant, can coat the closed carbon nanostructure (MWNT), do not modify the MWNT and can be selectively removed. Examples of protective coatings are polyacrylamides, polycarbonates, silicone, or co- and terpolymers of acrylates. Low melting temperature metals may also be used. Standard PMMA products cover a wide range of film thicknesses and are formulated with 495,000 & 950,000 molecular weight (MW) resins in either chlorobenzene or the safer solvent anisole. Custom MW products ranging from 50,000-2.2 million Daltons are also available and suitable for use herein. Various PMMA formulations are available as positive resists and are also useful in the present method. Other photoresist compositions may be used to remove a photoresist protective coating if they meet the above criteria. Other acrylates may be used. In general, the term acrylate as used herein refers to a homopolymer of alkyl acrylates or methacrylates where the alkyl contains C1 to C10 carbon atoms such as butyl acrylate, 2 ethyl hexyl acrylate, hydroxy ethyl acrylate and copolymers with other monomers.

Exposure of a Strip of the CNS by Coating Removal

After baking or otherwise solidifying the CNS protective coating, the polymer-MWNT film is peeled off, e.g. in an alkali solution. In one embodiment 1M KOH may be used. MWNTs embedded in the resulting polymer film have a narrow strip of side wall not covered by the polymer, owing to conformal polymer coating on the substrate.

The protective coating used should be separable from the substrate, either by scraping, peeling, melting, dissolving evaporation, or flowing of the protective coating (with the MWNT inside) off of the substrate. Alternatively, the substrate may be separated or removed from the MWNT-protective coating composite, without direct action on the coating. Again, one may use scraping, peeling, melting, dissolving evaporation, or flowing. Removal of the protective coating from the substrate will depend on the protective coating used. It is contemplated that the protective coating will remain in place around most of the circumference of the closed carbon nanostructure (MWNT) after removal, with only the tangential surface that was in contact with the substrate not protected. This tangential surface provides an exposed strip, i.e., not covered by the protective coating.

If a PMMA protective layer is used, an alternative removal agent is a PMMA resist stripper. Most N-methylpyrrolidinone (NMP) based strippers are highly effective to remove PMMA.

Etching Along the Exposed Strip

After separation of the coated CNS from the substrate, the exposed strip is exposed to a disruptive agent that will sever C—C bonds in the exposed strip of the CNS, without damaging the pristine graphene material or unduly modifying the exposed bonds. That is, the exposed bonds should to the extent possible be bound to hydrogen, rather than oxygen, hydroxy or some other species.

In a preferred embodiment, the exposed strip of the polymer-MWNT film is exposed to a low energy, essentially inert plasma for various times (FIG. 1B) in order to remove a few outer layers of the MWNT. In the exemplified embodiment, the plasma was argon plasma. A standard plasma etcher, having a pressure control and RF power source, can be used. The choice of plasma source is critical to longitudinally unzip CNTs. $O_2$ plasma was widely used for chemical etching of carbon materials. However, control experiments found that $O_2$ plasma etching tended to remove complete shells from MWNTs, even with the partial protection of the polymer, suggesting that the chemical etching of MWNTs by $O_2$ plasma was rapid along the nanotube circumference and could not be used to produce GNRs. The bombardment effect of Ar plasma offered anisotropic physical etching to remove atoms at unprotected sites along the longitudinal direction of the CNTs. The plasma is produced at relatively low power, i.e., on the order of less than 100 watts, preferably less than 20 watts. In exemplified embodiments, 5- or 10-Watt Ar plasma was used. Longer etching duration increases the yield of single- and few-layer GNRs, but may cause breaks in the GNRs. Etching duration is preferably less than one minute. Owing to protection by the polymer, the top side walls of MWNTs are etched faster and removed by the plasma to a depth depending upon the time of exposure to plasma. FIG. 1B, at d shows that for exposure time $t_1$, bilayer GNR with CNT core is formed. At time $t_2$, wherein $t_2>t_1$, trilayer GNR is formed (as shown in FIG. 1B at e). At time $t_3$, wherein $t_3>t_2$, bilayer GNR is formed (FIG. 1B at f). At time $t_4$, wherein $t_4>t_3$, a single-layer GNR is formed, as shown at g. Thus, single-, bi- and multilayer GNRs and GNRs with inner CNT cores are produced depending on the diameter and number of layers of the starting MWNT and the etching time. As shown at h, a single layer, or few-layer GNR can be recovered from the PMMA.

Alternative etching methods that break bonds in outer layers of MWNTs without chemical modification of the surface can be used, such as electron cyclotron resonance (ECR) plasma, nitrogen/hydrogen plasma, or other Nobel gas plasmas. It is important that the power and atmosphere in the sample chamber be controlled according to the GNR product desired.

Recovering the GNR

After etching along the exposed strip, the protective coating is removed; the coating may be applied to an inert substrate upon which the GNR will sit after removal of the protective coating. In the exemplified method, after etching of the exposed portion of the closed carbon nanostructure (MWNT) to open the structure along a longitudinal (axial) line, the polymer film containing the MWNT was contact-printed and attached to a Si substrate with a 500-nm-thick layer of $SiO_2$. Then the polymer film was removed using acetone vapor, followed by calcination to remove polymer residue on the target substrate, leaving pristine GNRs on the substrate (FIG. 1B, at h).

Characterization of GNRs

Atomic force microscopy (AFM) may be used to characterize the MWNTs and resultant GNRs. The GNR materials are deposited on substrates commonly used in AFM. An example of a suitable substrate is $SiO_2/Si$. AFM may be carried out on a standard instrument such as Nanoscope® IIIa multimode instrument (Veeco, Plainview, N.Y.). Tapping mode-AFM may be used. GNRs may also be characterized using Raman spectroscopy. Raman spectroscopy is a powerful approach to investigating the structural and electronic properties of carbon-based materials. The shape of the second-order Raman band (2D) is a characteristic that can be used to distinguish the number of layers of AB-stacked graphene (Ferrari et al 2006 *Phys. Rev. Lett.* 97:187401; Graf et al. 2007 *Nano Lett.* 7:238; Ni et al. 2008 *Nano Res.* 1:273). The Raman $I_D/I_G$ ratio is widely used to evaluate the quality of carbon nanotubes (Dresselhaus et al 2005, *Phys. Rep.* 409:47) and graphene materials (Ni et al. 2008, *Nano Res.* 1:273).

The majority of GNRs obtained by the present method are distinguished as single or few-layered ribbons with a width range of 10-20 nm. The edges of the obtained GNRs are very smooth, i.e., atomically smooth. GNRs uniform in width along their lengths with very little edge roughness are obtained by the present methods. The Raman $I_D/I_G$ ratio of the GNRs is lower than 0.5, preferably lower than 0.4. In a preferred embodiment, the average $I_D/I_G$ values are respectively 0.38, 0.30 and 0.28 for single-, bi- and tri-layer GNRs with 10-20 nm widths. A low ratio points to overall low defect density and to a very high quality of the product. The $I_D/I_G$ values are lower than those for GNRs obtained by lithographic etching of pristine graphene sheets, indicating the high quality of GNRs obtained by present method, in particular the high degree of edge smoothness.

GNR Electrical Devices

Single field effect transistors (FET)-like GNR devices and other GNR devices may be fabricated by making large array of source (S) and drain (D) electrodes to contact randomly or precisely deposited GNRs on $SiO_2$ (300 nm)/p++-Si substrates. The array of electrodes may be fabricated using electron beam lithography followed by electron-beam evaporation of palladium. The p++-Si is used as back gate and Pd (30 nm) is used as S and D electrodes. In one embodiment, GNRs of the present invention exhibit a resistivity between 10 and 40 kΩ.

In some cases, to improve quality, thermal annealing of the GNRs may be carried out in a non-oxidizing environment. This is aimed at reducing defects on the GNRs generated by the plasma etching process. Impurities may also be driven off. Thermal annealing may be carried out at high temperatures, above 600° C., preferably above 700° C. A stream of gas such as $H_2$ may be used. Gases used may be hydrogen, nitrogen, helium, argon, etc. In one example, thermal annealing is done in 1 Torr of $H_2$ at 800° C. for 20 min to improve the electrical properties of GNRs.

GNR Device Arrays

The present GNRs can be prepared in predetermined patterns and used in an integrated circuit comprising a number of FETs. As is known, a field-effect transistor (FET) is a three terminal (namely drain, source and gate) semiconductor device in which current conduction is by only one type of majority carriers (electrons in case of an N-channel FET or holes in a P-channel FET). It is also sometimes called the uni-polar transistor. Unlike a biploar transistor a FET requires virtually no input (bias signal) current and gives an extremely high input resistance—most important advantage over a BJT. Either BJT or FET devices can be used to operate in amplifier circuits or other similar electronic circuits, with different bias considerations. One type of FET is the tunneling FET (TFET). Graphene nanoribbons (GNRs) have a width-tunable narrow bandgap, which is particularly favorable for TFET applications, and more amenable to planar processing and large-scale integration than carbon nanotubes (CNTs). A schematic of such a device is given in Zhang et al. "Graphene Nanoribbon Tunnel Transistors," *IEE Electron Device Letters EEE Electron Device Letters*, vol. 29, issue 12, pp. 1344-1346 (November 2008)

In one embodiment of the present invention, a predetermined array of highly aligned, narrow GNRs can be made from aligned array of single-walled carbon nanotubes (SWNTs), MWNTs or other CCNs by the presently disclosed polymer-protected plasma etching method, e.g., as illustrated in the schematic drawing in FIGS. 15A and B, where a CNT array is converted to a GNR array. The starting materials may be dense, uniform, highly aligned arrays of long CNTs grown in a pattern. This may be done on ST-cut quartz by CVD. A large variety of metals, including Fe, Co, Ni, Cu, Pt, Pd, Mn, Mo, Cr, Sn, Au, Mg, and Al have been used to successfully catalyzed the growth of such tubes on stable temperature (ST)-cut quartz by lattice guidance. See, Yuan et al., "Horizontally Aligned Single-Walled Carbon Nanotube on Quartz from a Large Variety of Metal Catalysts," *Nano Lett.* 8(8): 2576-2579 (2008).

CNTs used may comprise a mixture, such as SWNTs and few-walled CNTs. In one example, arrays of CNTs include up to about 80% SWNTs and about 20% few-walled CNTs and bundles. The CNTs could be as long as 1 mm. The diameter of the SWNTs used may range from 0.6 to 3.4 nm.

The density of the tubes is not critical, but may be in the range of 0.5 to 20, preferably 1-2 tubes/μm, where high densities allow for more devices. Aligned CNTs are first partially embedded in a polymer film and the unprotected sides of CNTs are then exposed to plasma, as described above. As described above, Ar plasma is applied and the polymer film serves as an etching mask and enables the longitudinal unzipping of CNTs. The alignment of CNTs is maintained through embedding in the polymer film, unzipping by plasma and transferring to another substrate. Markers (e.g., gold) may be used to track specific CNTs through the unzipping process.

An as-grown CNT array can be transferred from the original substrate to a substrate on which the GNRs will reside, and which will be useful for fabrication of a nano-electronic device. For example, the CNT array on quartz may be transferred to $SiO_2$/Si substrates with sputtered gold marker array by a nano-transfer printing technique as disclosed in Jiao, et al. (Creation of nanostructures with poly (methyl methacrylate)-mediated nanotransfer printing. *J. Am. Chem. Soc.* 2008, 130, 12612-12613). The CNT array is then unzipped following a similar procedure as disclosed above to form a corresponding GNR.

AFM imaging and Raman spectroscopic measurements may be performed on the same CNTs before and after the unzipping process to obtain spectroscopy evidence of successful unzipping of CNTs into GNRs. Both the obvious decrease in topographic height and changes in Raman spectra of the same CNTs after unzipping confirm the creation of GNRs. The presently disclosed method also allows for the formation of crossbars of GNR-GNR and GNR-CNT for the first time.

Using these methods, the GNR array maintains the main features of the parent CNT array including high density, good alignment and ultra-long length. The widths of most GNRs obtained in the examples below (Examples 12-15) fell into the range of 2-8 nm. The edges of the GNRs appeared smooth and uniform along the length of GNRs. GNR-CNT junction-like structures may also be observed in some partially unzipped tubes due to non-uniform etching caused by local deformations of the polymer film.

The aligned GNRs may be formed into a variety of predetermined patterns and used as building blocks for constructing complex two-dimensional (2D) structures. Crossbar structures potentially useful as logic and memory elements in nanoelectronics are fabricated as previously disclosed [Rueckes, et al., Carbon nanotube-based nonvolatile random access memory for molecular computing. *Science* 2000, 289, 94; Melosh et al., Ultrahigh-density nanowire lattices and circuits. *Science* 2003, 300, 112; Fuhrer et al., Crossed nanotube junctions. *Science* 2000, 288, 494] using GNR arrays. Crossbar arrays of GNRs may be fabricated by transferring aligned GNR array on top of another array with a rotation of 90°. In one embodiment, two layer of GNR arrays forms well ordered square mesh structures as evidenced by AFM and Raman G-band images. Field-effect transistors (FETs) with individual and array of GNRs as channel materials show on/off current ($I_{on}/I_{off}$) ratios up to $10^3$ and 20, respectively.

EXAMPLES

Example 1

Preparation of GNRs 1 mg of MWNTs was dispersed in 10 ml of 1% Tween 20 aqueous solution by sonication for 5 min and then centrifugation at 16,400 g for 10 min to remove aggregates. The MWNT suspension was deposited onto a Si substrate pretreated with 3-aminopropyltriethoxysilane (APTES, 12 ml in 20 ml of $H_2O$), rinsed with water and then blow-dried. The sample was then calcined at 350° C. for 10 min to remove the Tween 20. A PMMA solution (relative molecular mass, Mw 5495,000; 5% in anisole) was spin-coated on MWNTs on the substrate at 3,000 rounds per minute for 1 min and then baked at 170° C. for 2 h on a hot plate. The PMMA-MWNT film was peeled off in 1M KOH solution at 80° C. (Jiao et al 2008 *J. Am. Chem. Soc.* 130:12612). Then the film was rinsed with water and contact-printed onto a Si substrate. To make the film well-adhered to the Si substrate, the sample was heated at 80° C. for 10 min in an oven. Ten-watt Ar plasma was used to etch the PMMA-MWNT film at the base pressure of 40 m Torr. After etching, the PMMA film was lifted using water and then adhered to an APTES-treated, 500-nm $SiO_2$/Si substrate with a prefabricated Pt/W marker array. After the PMMA had been removed using acetone vapor, the obtained sample was calcined at 300° C. for 10 min to remove the residue of PMMA.

Example 2

Histograms of Pristine MWNTs and GNRs

Figure 3A:
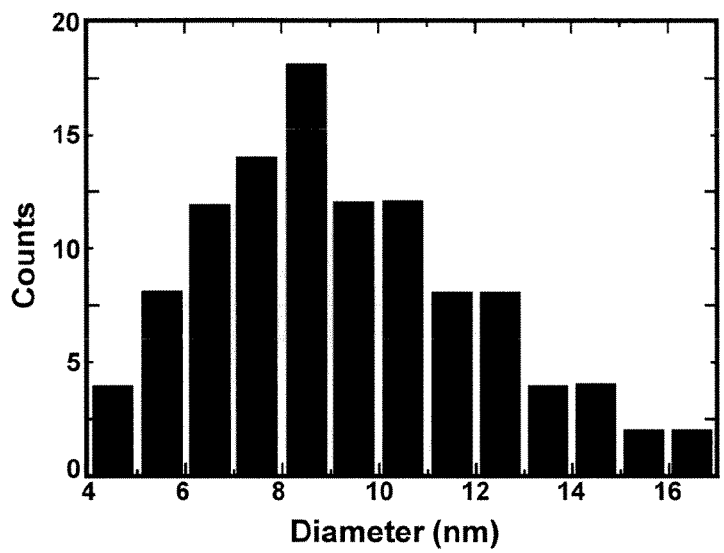
FIG. 3A-C is a series of histograms showing the counts (numbers) of MWNTs (A) and GNRs (B) and (C), by diameter, width and height, respectively.
Figure 3B:
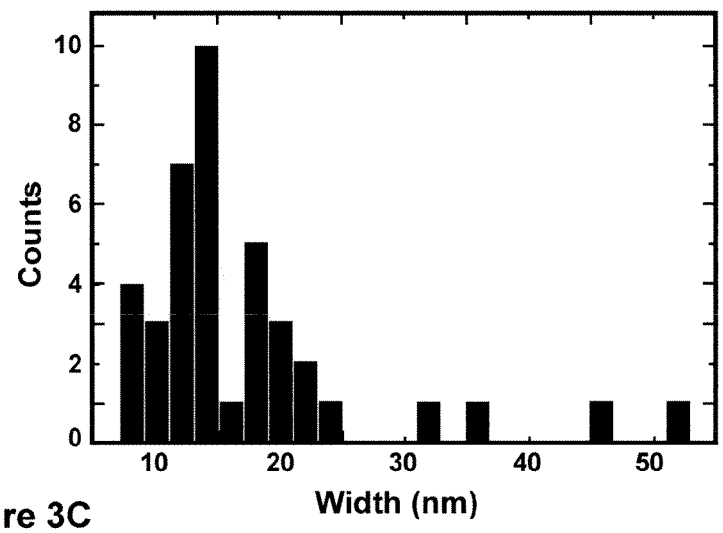
Figure 3C:
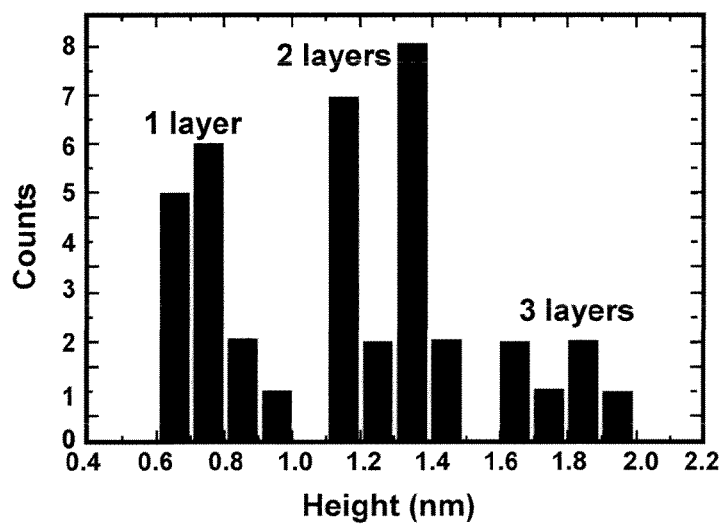

The diameter of more than 100 MWNTs (Bucky tube, Aldrich) on Si substrate was measured with atomic force microscopy (AFM). FIG. 3A shows the diameter distribution of pristine MWNTs. The distribution of diameters ranged from 4 to 18 nm and the mean diameter was ~8 nm. Because of the difficulties of distinguishing multi-layer GNRs from GNRs with CNTs cores by AFM, only the widths and heights of single or few-layer GNRs were measured (height <2 nm). As shown in FIG. 3B, the widths of most GNRs were in the range of 10 to 20 nm. The heights of GNRs distributed around three discrete values, i.e., ~0.8 nm, 1.3 nm and 1.8 nm (FIG. 3C), which were assigned to single-, bi- and tri-layer GNRs, respectively. Most GNRs obtained were single and bi-layer.

Example 3

Yield of Single- and Few-Layer GNRs

The yield of single and few-layer GNRs was determined by the diameter, number of shells of the starting MWNTs and the etching time. The yield of GNRs with high quality was ~20% after etching for 10 s. By assuming that the width of GNRs was comparable with half of the circumference of the starting MWNTs, that GNRs with a width of 10-20 nm were estimated to be converted from MWNTs with a diameter of 6-12 nm. From the diameter distribution of MWNTs (FIG. 3A) ~40% of pristine MWNTs had a diameter of 6-12 nm. However, the number of shells of MWNTs varied even with the same diameter and only few-walled CNTs could generate single or few-layer GNRs. Therefore, the yield of single and few-layer GNRs was much lower than 40%.

Example 4

Characterization of GNRs by AFM

Figure 2A:
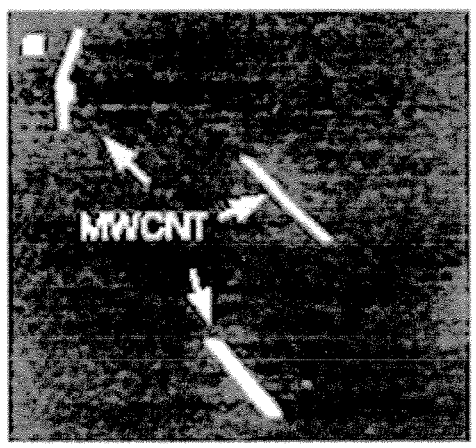
FIGS. 2A and B are AFM images. Scale bars, 1 μm

AFM images of GNRs were taken with a Nanoscope IIIa multimode instrument in tapping mode. The mean diameter of starting MWNTs was ~8 nm (FIG. 2A and FIG. 3A). For 10 s of Ar plasma etching, present method converted ~20% of the MWNTs into single- or few-layer GNRs of 10-20-nm width (height, <2 nm).

Figure 2B:
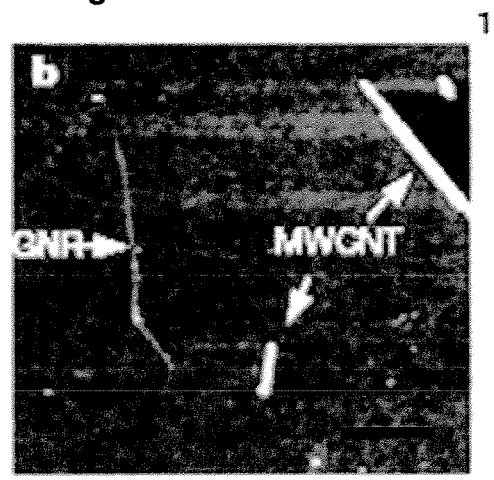
FIG. 2B shows an image of the substrate after the GNR conversion process, showing coexistence of MWNTs and GNRs.

FIGS. 2A and 2B show AFM images of GNRs converted from MWNTs. Scale bars, 1 μm FIG. 2A shows an AFM image of raw MWNTs dispersed on a Si substrate. FIG. 2B shows an image of the substrate after the GNR conversion process, showing coexistence of MWNTs and GNRs. In other images, not shown, single- or few-layer GNRs of different widths and heights were identified, such as, 7 and 1.8 nm; 8 and 1.8 nm; 13 and 2.0 nm; 15 and 0.9 nm; 17 and 1.0 nm; 25 and 1.1 nm; 33 and 1.4 nm; 45 and 0.8 nm; and 51 and 1.9 nm. The height scale for all the AFM images was 10 nm.

Other products were multilayer GNRs or GNRs with CNT cores (FIG. 1B at d). The yield of GNRs was limited by the relatively wide diameter distribution of the starting MWNTs used (See Example 3). All of the width data were obtained after correcting the tip-size effect (as disclosed in Li et al. 2008 *Science* 319:1229). Within the resolution of AFM, the edges of the obtained GNRs were very smooth. Unlike for previous GNRs, the ribbons were uniform in width along their lengths, none being wedge shaped, owing to the quasi-one-dimensional CNT templates with uniform diameter along their lengths. According to histogram data on GNRs (FIGS. 3B and 3C), the widths of GNRs mostly fell into the range 10-20 nm, which is narrower than that of GNRs made by the sonochemical method (as disclosed in Li et al. 2008 *Science* 319: 1229). The width of 10-20 nm corresponds to half of the circumference of the starting MWNTs with the mean diameter of ~8 nm. The heights of obtained GNRs were ~0.8, 1.3 and 1.8 nm, which is assigned to single-, bi- and trilayer GNRs, respectively. The folding observed in single-layer GNRs suggests that the flexibility of the GNRs is excellent in comparison with that of MWNTs. The folds resulted from bending of the PMMA film and/or the perturbation of liquid during the removal of the PMMA in acetone.

Example 5

Characterization of GNRs Using Raman Spectroscopy

Raman spectra of individual GNRs located by AFM were measured using a 633-nm HeNe laser (spot size, ~1 μm) and a power of ~1 mW. The mapping area was set to be 3 μm×3 μm and the step size was 100 nm. The D-, G- and 2D-bands were recorded and the integration time was 10 s at each spot.

Figures 4A, 4B:
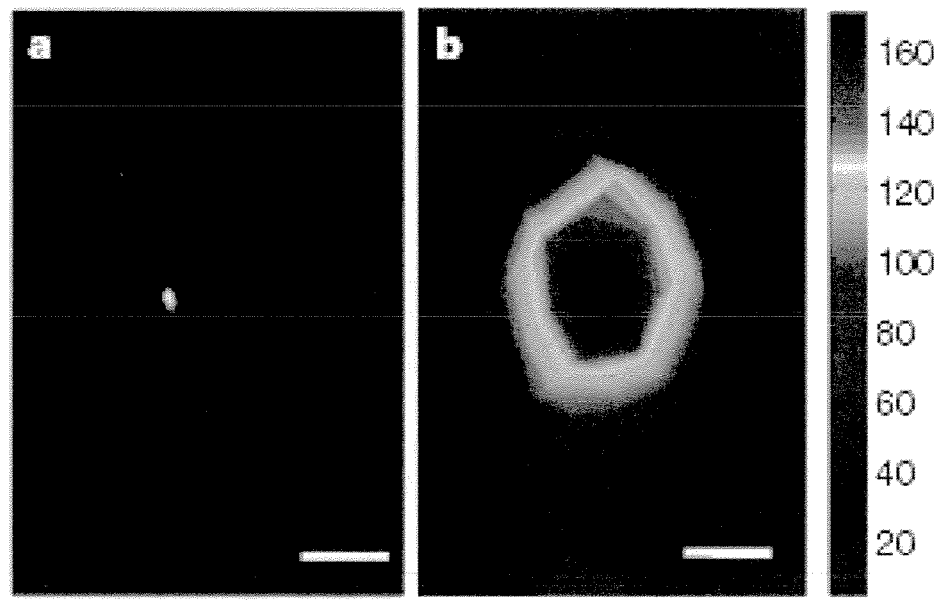
FIG. 4A-C shows Raman imaging and spectra of a single layer GNR obtained according to the present method.
Figure 4C:
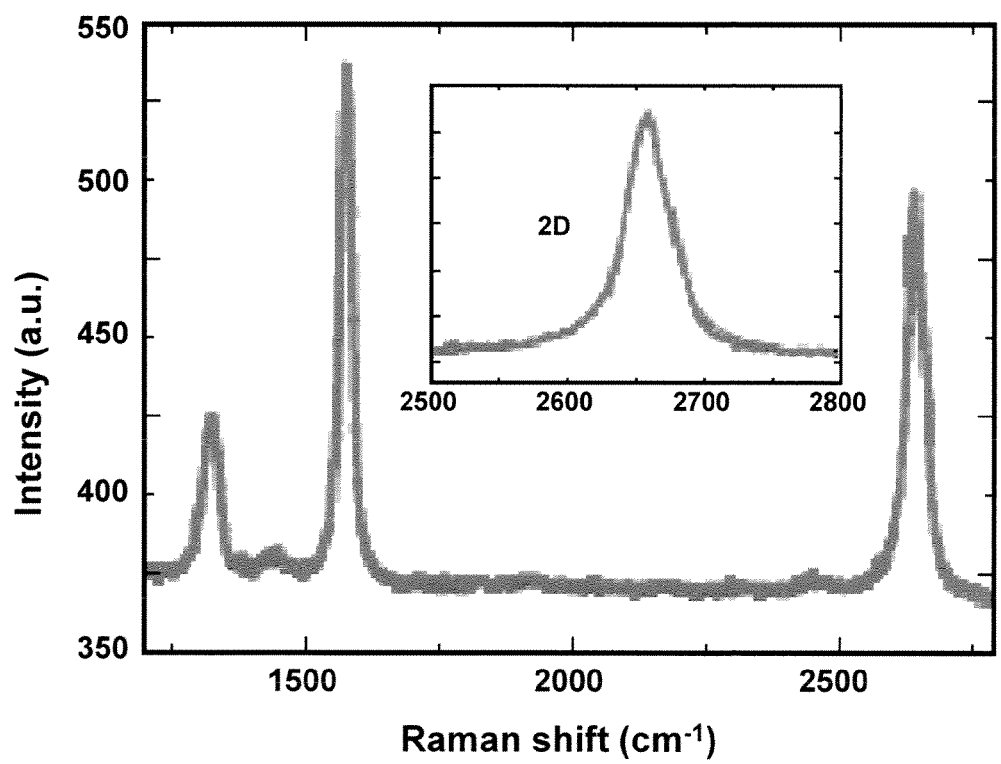
Figures 4D, 4E:
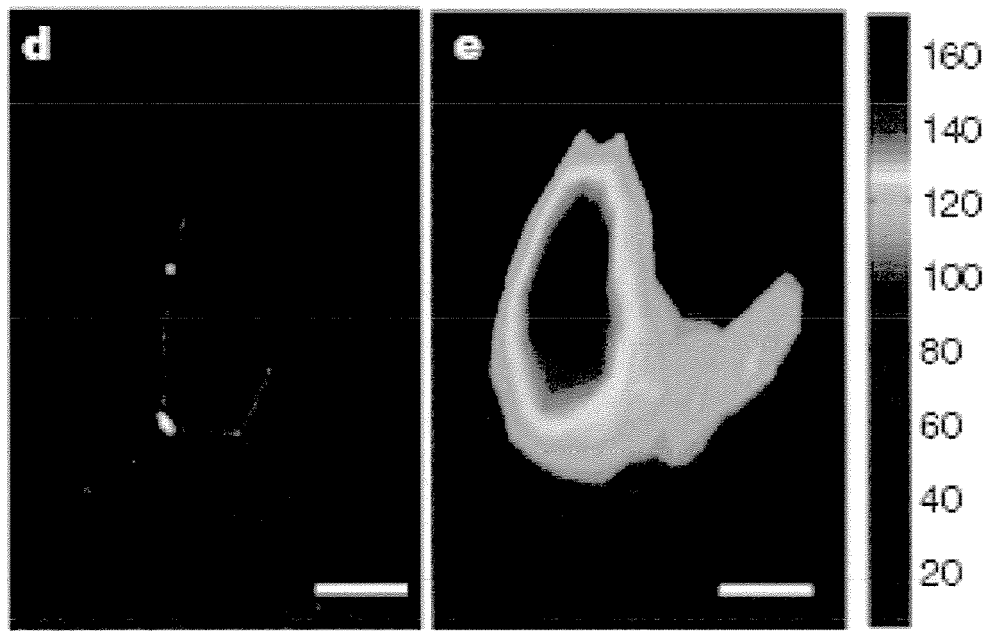
FIGS. 4D-F, shows further data from a GNR, as in the case of FIG. 4A-C, except that a bilayer GNR is illustrated. Shown are an AFM image of the GNR (FIG. 4D), a G-band Raman image (FIG. 4E) and the Raman spectrum (F) of the bilayer GNR. A 2D-band spectrum of the GNR and the best-fit curve, which is a combination of four Lorentzians revealed a single peak at about 2670 (not shown). The ~1,440 cm-1 peaks in FIG. 4C and FIG. 4F are attributed to trace PMMA left on the SiO$_2$. Scale bars, 200 nm.
Figure 4F:
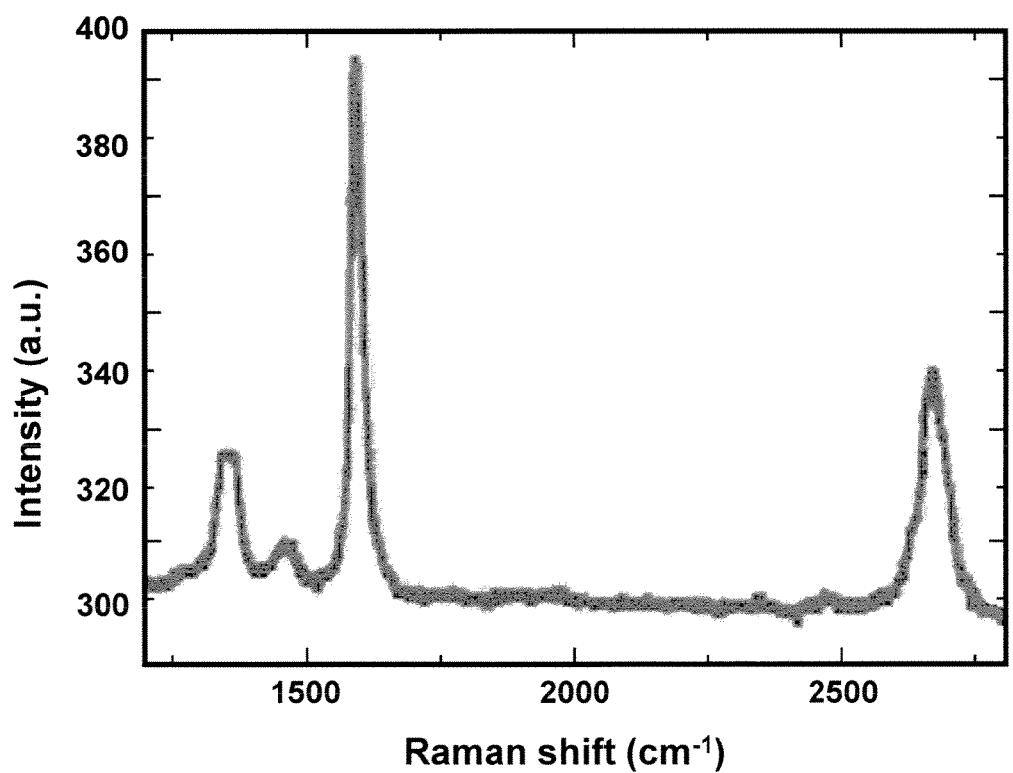
Figure 5:
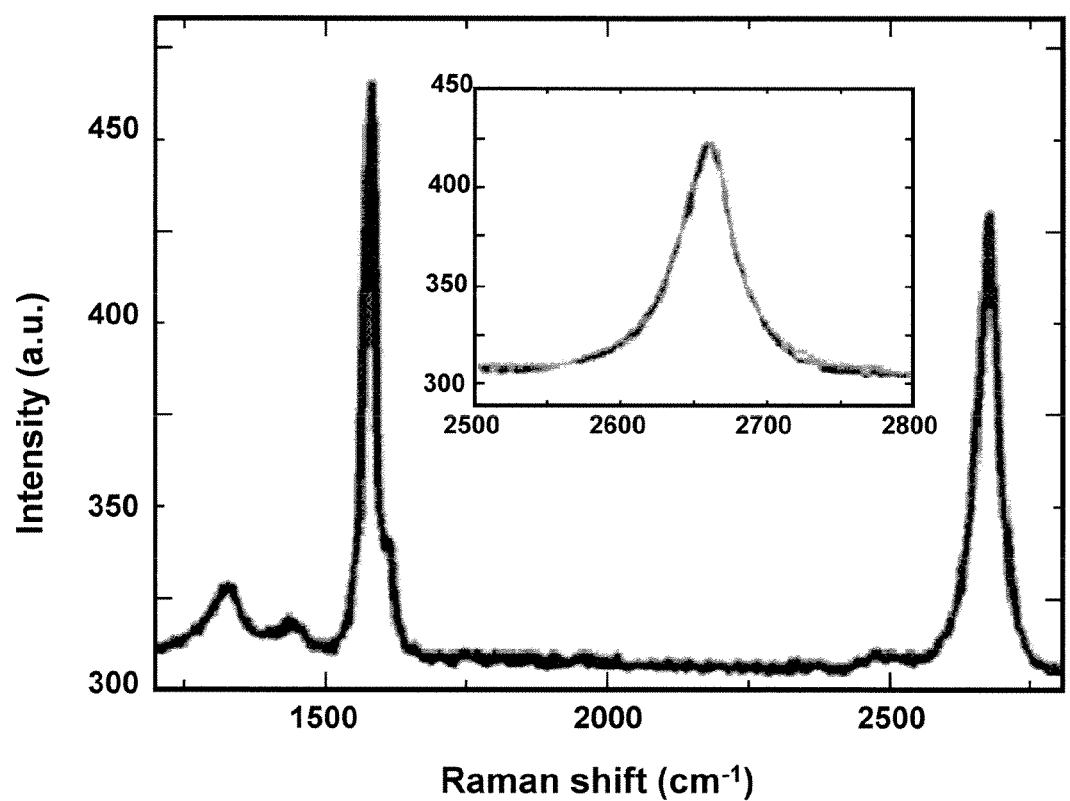
FIG. 5 is a graph that shows a Raman spectrum of a non-AB-stacked bi-layer GNR. The width and height of the GNR are 25 nm and 1.4 nm, respectively. The height of the GNR is similar to other bi-layer GNRs with AB stacking. Inserted is a graph showing a 2D band peak and the best-fit curve (which appear as one line) as a single Lorentzian expected for non-AB stacked bi-layer GNR.

Confocal Raman mapping was carried out on single-, bi- and trilayer GNRs (as above). An AFM image was obtained (FIG. 4A) and a G-band image (FIG. 4B) of a 0.9-nm-thick GNR on the same length scale. The 2D peak was well fitted by a sharp and symmetric Lorentzian peak (inset, FIG. 4C), suggesting the single-layer nature of the GNR. For another 1.3-nm-thick GNR (FIG. 4D-F), the 2D peak was fitted by four Lorentzians, characteristic of bilayer, AB-stacked graphene. Some bilayer GNRs showed 2D peaks with different line shapes from AB-stacked graphene, reflecting the varying stacking structures between layers in the starting MWNTs (FIG. 5). For a trilayer GNR (height, ~1.9 nm; see FIG. 6), similar to trilayer, ABA-stacked graphene sheets, the 2D-band was broader and up shifted as the thickness increased (see Table given below in Example 6). It is to be noted that the 2D band of the MWNTs was broader than that of obtained GNRs (FIG. 9), as expected.

The intensity ratio of the D- and G-bands (ID/IG) is commonly used to evaluate the quality of carbon materials. No obvious D-band was observed for any of the MWNTs dispersed on substrates (FIG. 9), suggesting the high quality of the starting materials. The average ID/IG values were respectively 0.38, 0.30 and 0.28 for obtained single-, bi- and trilayer GNRs with 10-20-nm widths. Because defect density on the pristine MWNTs was low, the D-band Raman signal of obtained GNRs should be mainly due to their open edges. The $I_D/I_G$ values were lower than those for GNRs obtained by lithographic etching of pristine graphene sheets ($I_D/I_G$ was ~2 for a bilayer GNR of ~28-nm width obtained by lithographic patterning (X. R. Wang et al., unpublished data; see FIG. 8), indicating the high quality of obtained GNRs, in particular the high degree of edge smoothness.

Example 6

Raman Spectra of GNRs

Figure 6:
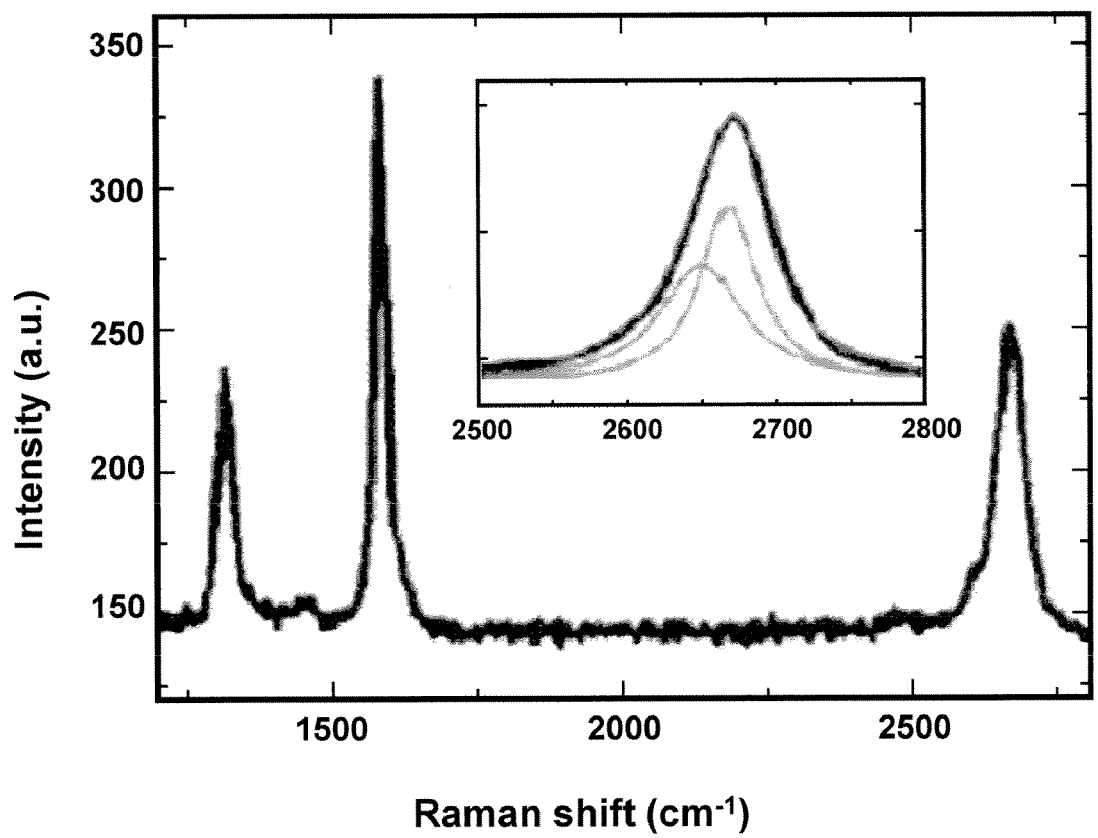
FIG. 6 shows a Raman spectrum of a tri-layer GNR. The insert shows a 2D band spectrum and the best-fitted curve with two Lorentzian peaks (Lorentzian peaks are below the single, higher peak).

The phonon energies and the Raman shift observed for 2D-band depend on the electronic structure of the graphene films. The 2D line shape of single layer graphene is composed of one Lorentzian peak. For AB-stacked bi-layer graphene, the strong interaction between the two layers splits the degenerate electronic conduction (and valence) bands, giving rise to four Lorentzian components in the 2D peak. For non-AB-stacked structures, the interaction between the two layers is weak and the 2D peak remains as a single Lorentzian peak. FIG. 5 shows a typical Raman spectrum of a non-AB-stacked bi-layer GNR observed in experiments. The full width of half maximum (FWHM) of the 2D-band of this GNR was ~48 $cm^{-1}$, much wider than the 2D peak of single layer GNRs (FWHM ~38 $cm^{-1}$). FIG. 6 shows a typical Raman spectrum of a tri-layer GNR. The 2D band could be fitted with two Lorentzian peaks, characteristic of few-layer ABA-stacked graphene. The percentage of tri-layer GNRs is very low compared with single and bi-layer ones, so there were few Raman data of tri-layer GNRs. The positions and FWHM of 2D-band for single, AB-stacked bi- and ABA-stacked tri-layer GNRs are recorded in the table given below.

| Number of layers | 2D-band position ($cm^{-1}$) | 2D-band FWHM ($cm^{-1}$) |
| --- | --- | --- |
| 1 | 2659 | 38 |
| 2 | 2665 | 54 |
| 3 | 2673 | 60 |

The table above shows 2D-band positions and FWHM for GNRs with different number of layers.

Figure 7:
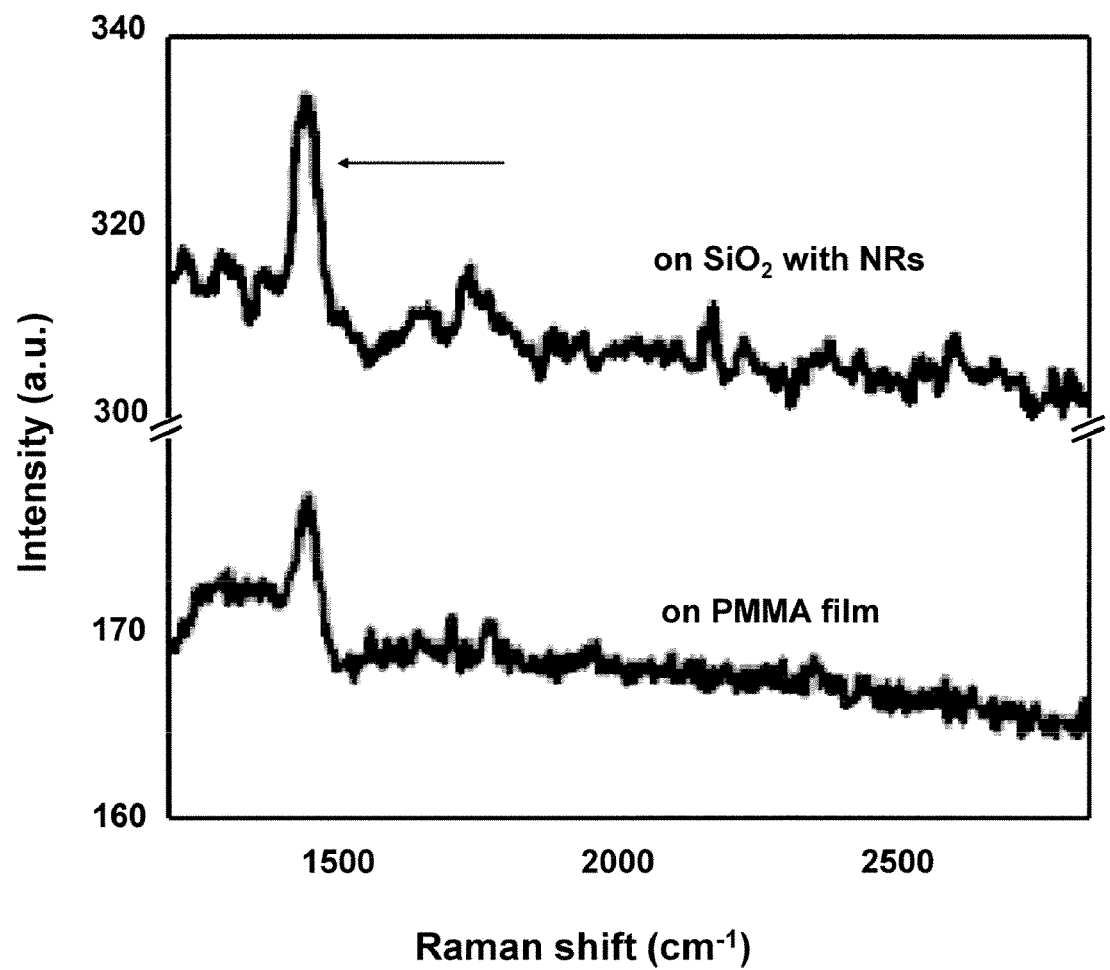
FIG. 7 shows Raman spectra of SiO$_2$ substrate with transferred GNRs and PMMA film.
Figure 8:
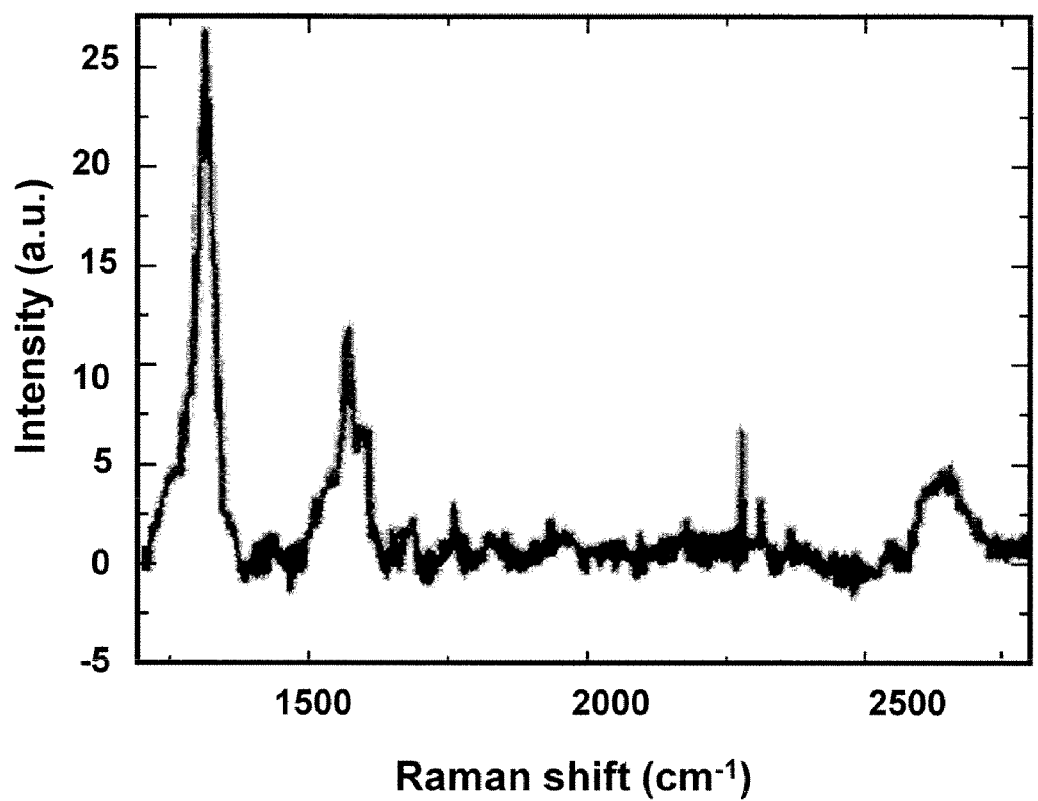
FIG. 8 shows a Raman spectrum of a bi-layer GNR (~28 nm wide) obtained by lithographically etching of pristine-graphene sheets. Inset is the AFM image of the GNR, scale bar: 200 nm.

The up-shift and broadening of the 2D-band was consistent with AB-stacked graphene sheet. The low frequency region (100-300 $cm^{-1}$) of GNRs was also measured and the radial breathing mode (RBM) which is intrinsic to CNTs was not observed. A small peak at ~1440 $cm^{-1}$ (arrow in FIG. 7) was observed in Raman spectra of GNRs. Control experiments found that this peak was attributed to trace PMMA left on $SiO_2$ after transferring GNRs (FIG. 7). FIG. 8 shows a typical Raman spectrum of a bi-layer GNR obtained by lithographic etching of pristine-graphene sheets. Compared with GNRs produced by present approach, the $I_D/I_G$ of lithographic patterned GNR was high (~2.0) and the 2D peak was broader (~90 $cm^{-1}$), suggesting the quality of obtained GNRs was higher than lithographically patterned ones.

Example 7

Raman Spectra of Pristine MWNTs

Figure 9A:
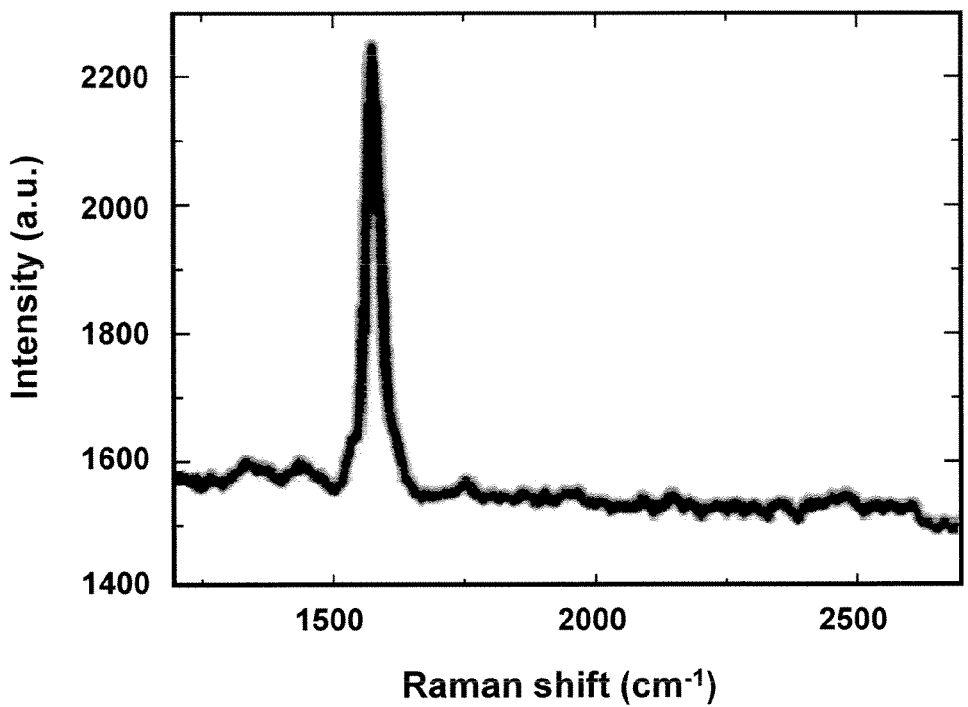
FIGS. 9A and B shows Raman spectra of pristine MWNTs on SiO$_2$/Si substrate.
Figure 9B:
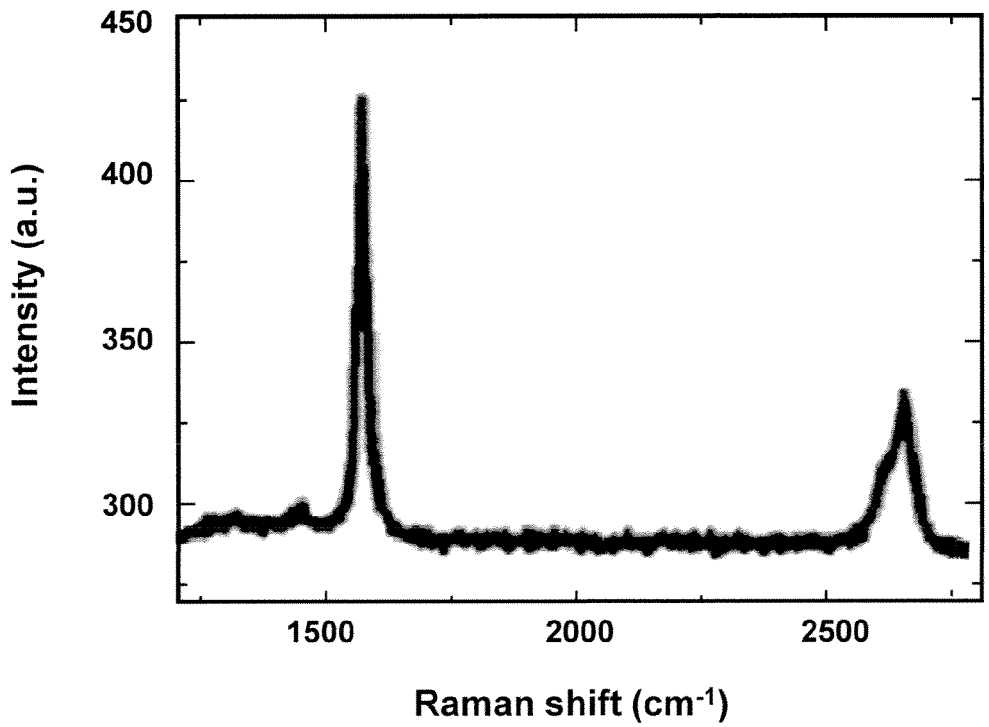
FIG. 9B, Raman spectrum of a MWNT with 2D-band.

Because MWNTs contain an ensemble of CNTs with diameters ranging from small to very large, the Raman spectra of MWNTs are complex and each MWNT shows Raman spectrum with different line shape. FIG. 9 shows two typical Raman spectra of individual MWNTs. 2D-band was observed on some MWNTs and could be fitted with multiple peaks. The 2D-band width of MWNTs (>60 $cm^{-1}$) was broader compared with single-walled carbon nanotube (~25 $cm^{-1}$), single (~40 $cm^{-1}$) and bi-layer GNRs (~55 $cm^{-1}$). No obvious D-band was observed on all the MWNTs, which indicated the high quality of the raw materials.

Example 8

Choice of Plasma Source and Etching Parameters

Figure 10A:
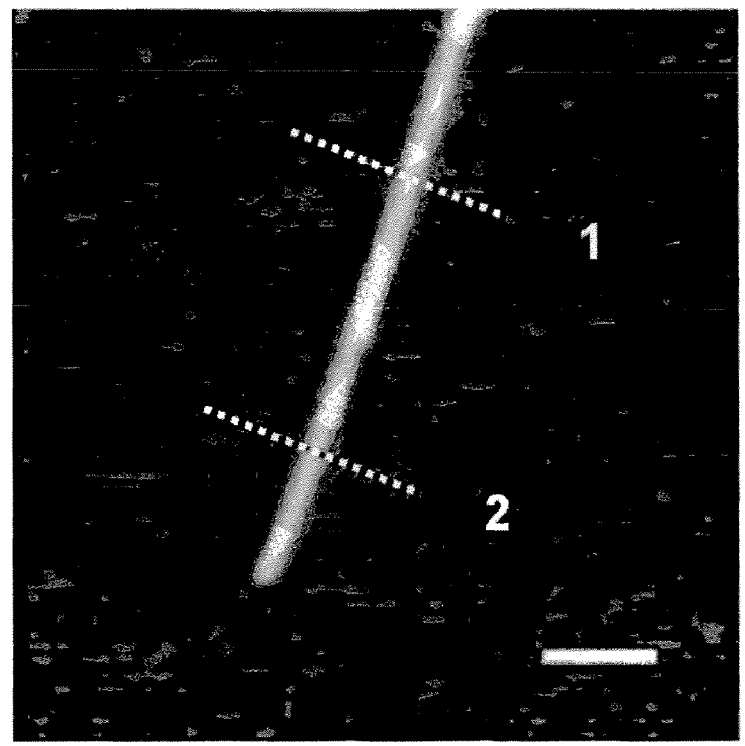
FIG. 10A is an AFM image of a MWNT after etching by O$_2$ plasma.
Figure 10B:
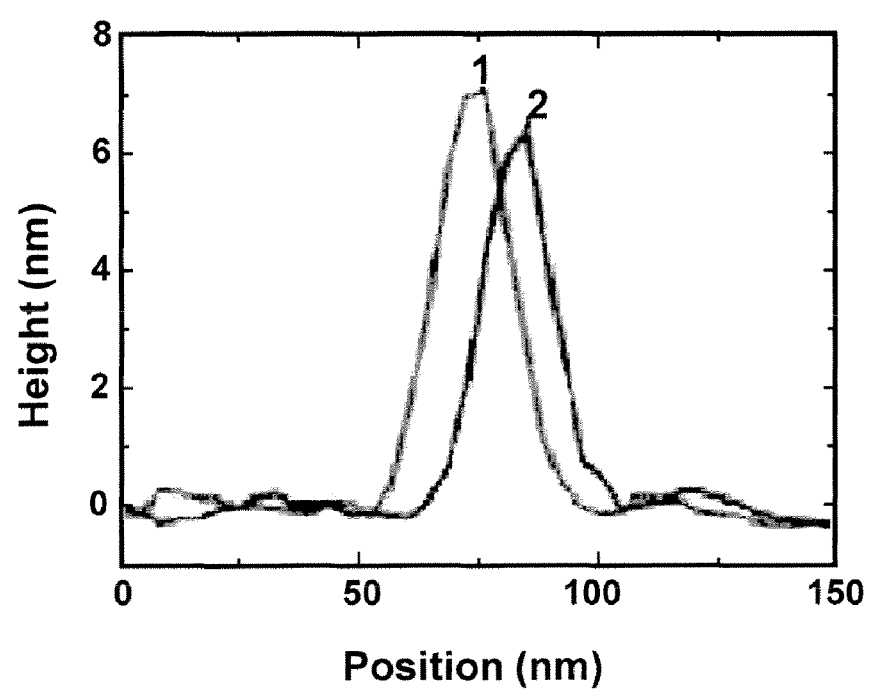
FIG. 10B shows cross sections of the MWNT along line 1 and 2.
Figure 11:
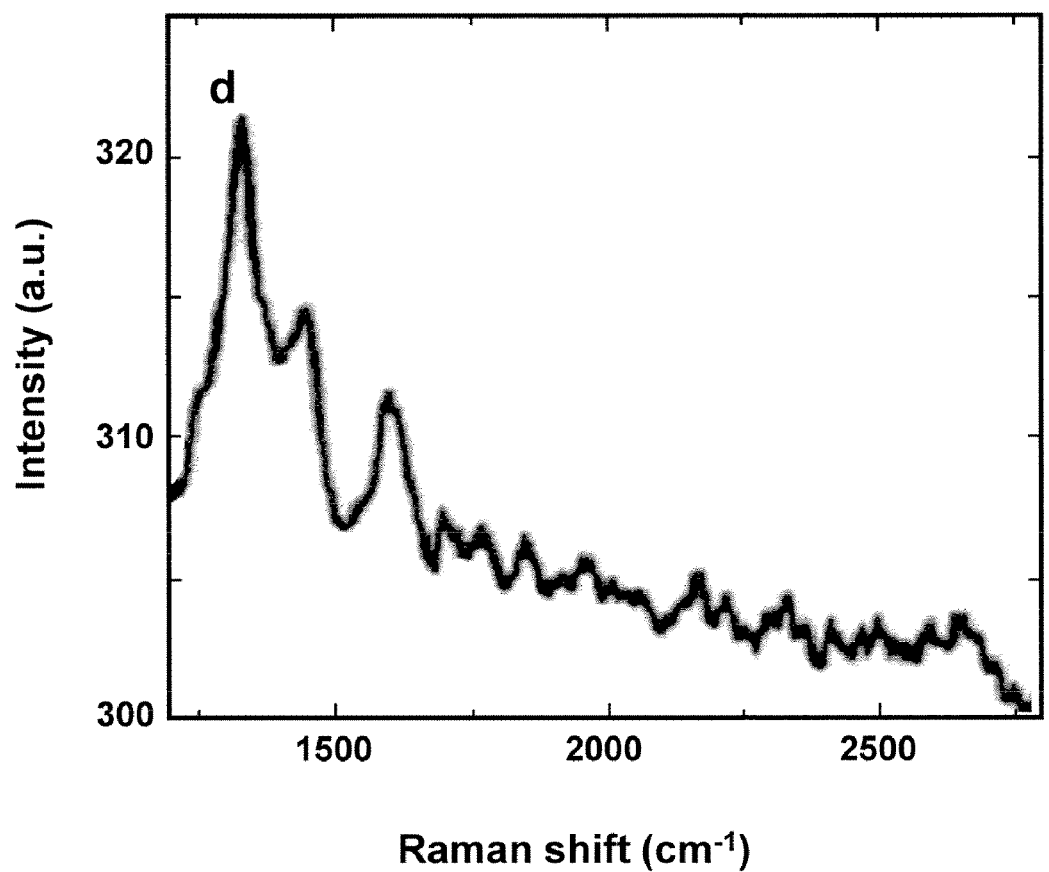
FIG. 11 is a Raman spectrum of a GNR obtained by etching for 30 s. An AFM image of the GNR was also obtained (data not shown).

Control experiments found that $O_2$ plasma etching tended to remove complete shells from MWNTs, even with the partial protection of PMMA (FIG. 10), suggesting that the chemical etching of MWNTs by $O_2$ plasma was rapid along the nanotube circumference and could not be used to produce GNRs. $O_2$ plasma etching of CNTs was isotropic even with the partial protection of PMMA. The height difference along the same MWNT (FIG. 10) indicated the removal of the shells of MWNT by $O_2$ plasma. The height difference of the two sections along the MWNT was ~0.8 nm, corresponding to one or two shells. The bombardment effect of Ar plasma offered anisotropic physical etching to remove atoms at unprotected sites along the longitudinal direction of the CNTs. A low plasma power of 10 W was used to make the etching more controllable and the etching time optimized. To find out the optimized etching time, different etching times were tested. The Raman spectrum of a GNR obtained by etching for 30 s is shown in FIG. 11. Longer etching duration increased the yield of single- and few-layer GNRs, but caused breaks in the GNRs. After etched for 20 s and longer, ribbons tended to be discontinuous and have frequent cuts. Raman spectra of GNRs obtained by etching for 30 s showed high ID/IG values, of 1.0 (FIG. 11).

Example 9

Fabrication of GNR Devices

The GNRs were located with AFM and their locations relative to the prefabricated Pt/W markers recorded. The source-drain electrode pattern was then designed to provide electrical contact to the GNRs; this was carried out by electron beam lithography, 20-nm Pd metal deposition and lift off. The devices were then annealed in Ar at 220° C. for 15 min to improve the contact quality. Electrical characterization of the devices was carried out both in air and in vacuum using a semiconductor analyzer (Agilent 4156C).

Example 10

Characterization of GNR Devices

Figure 12A:
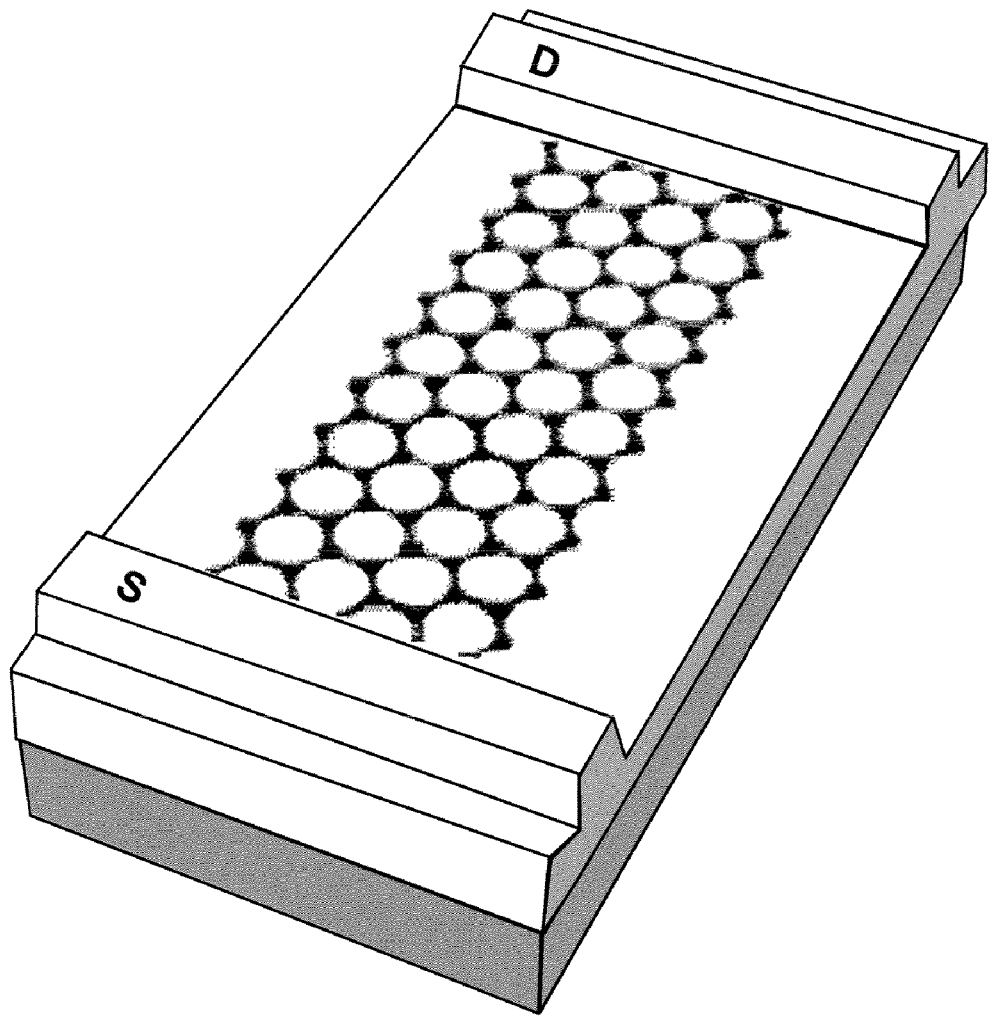
FIG. 12A-D shows GNR devices, in particular room-temperature electrical properties of GNR devices.
Figure 12B:
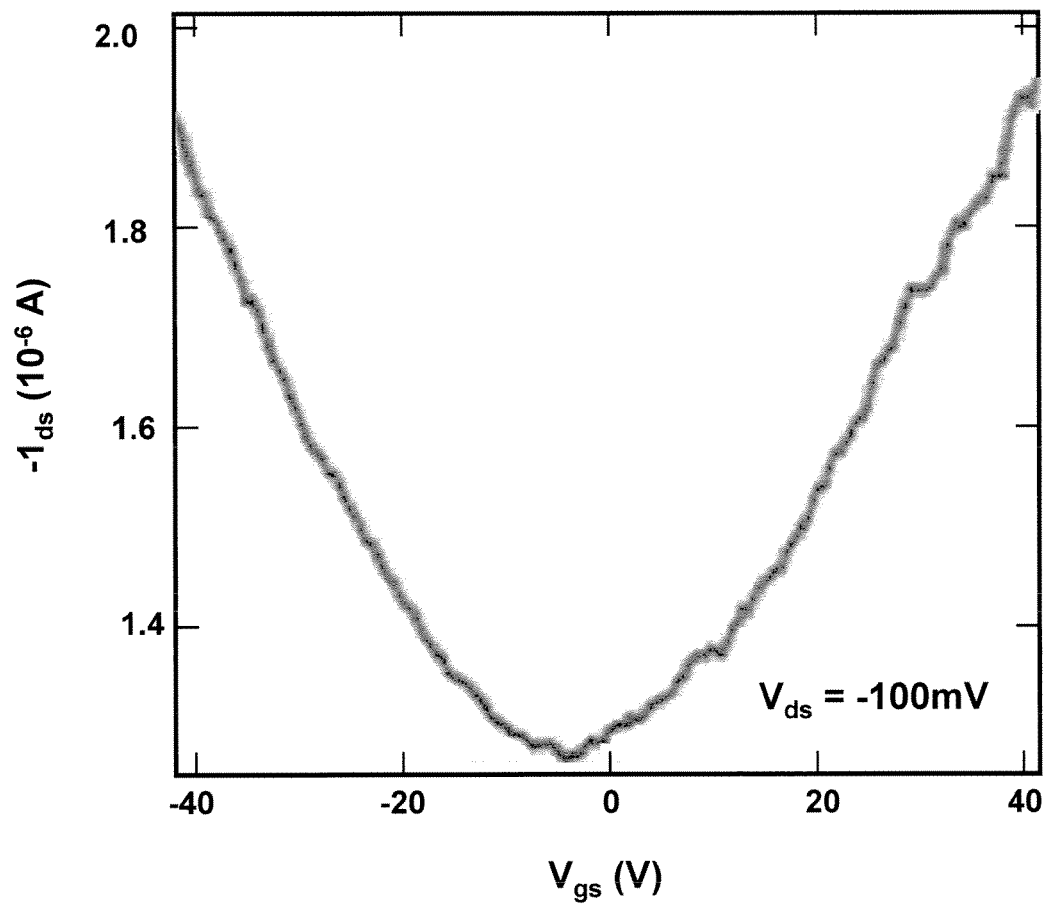
Figure 12C:
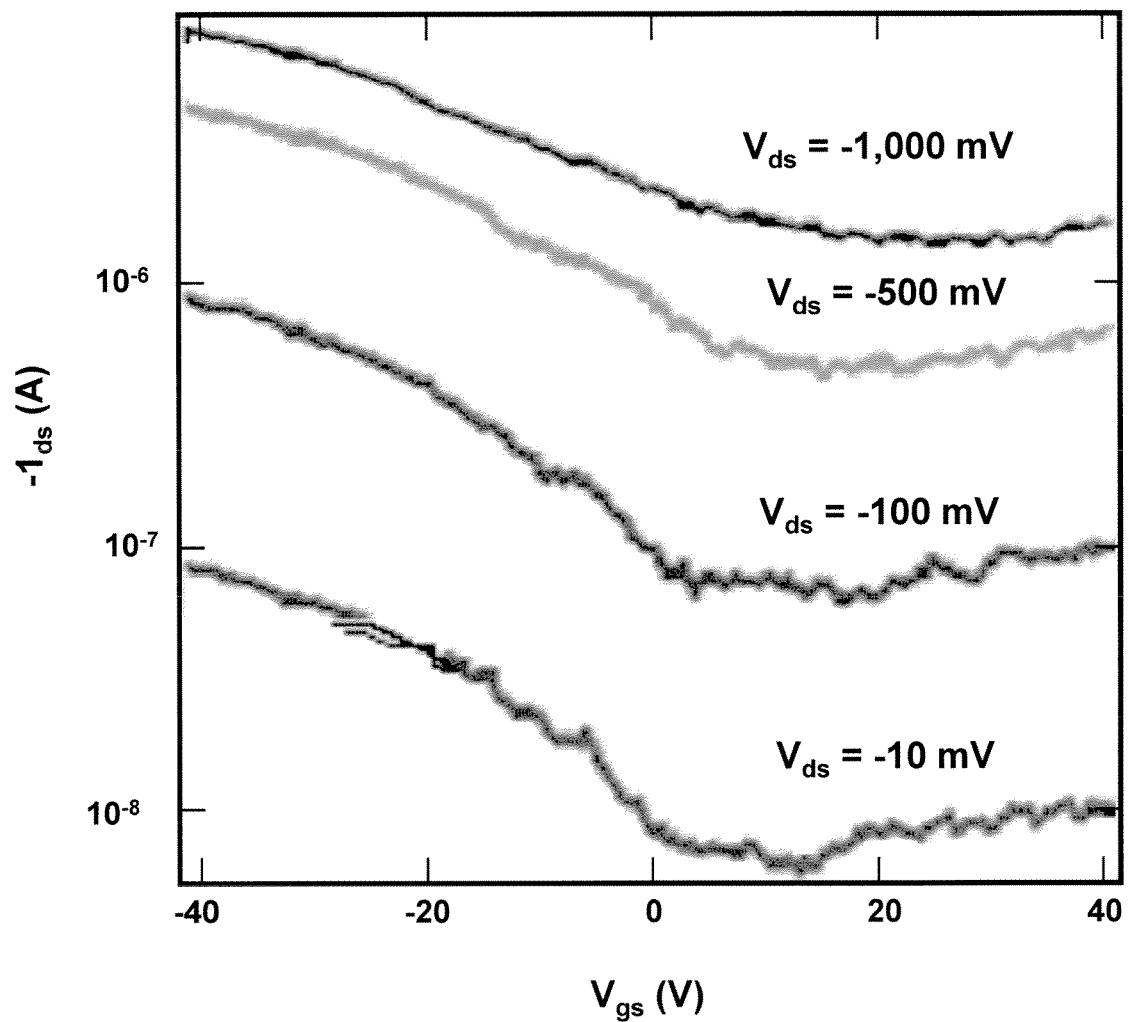
Figure 12D:
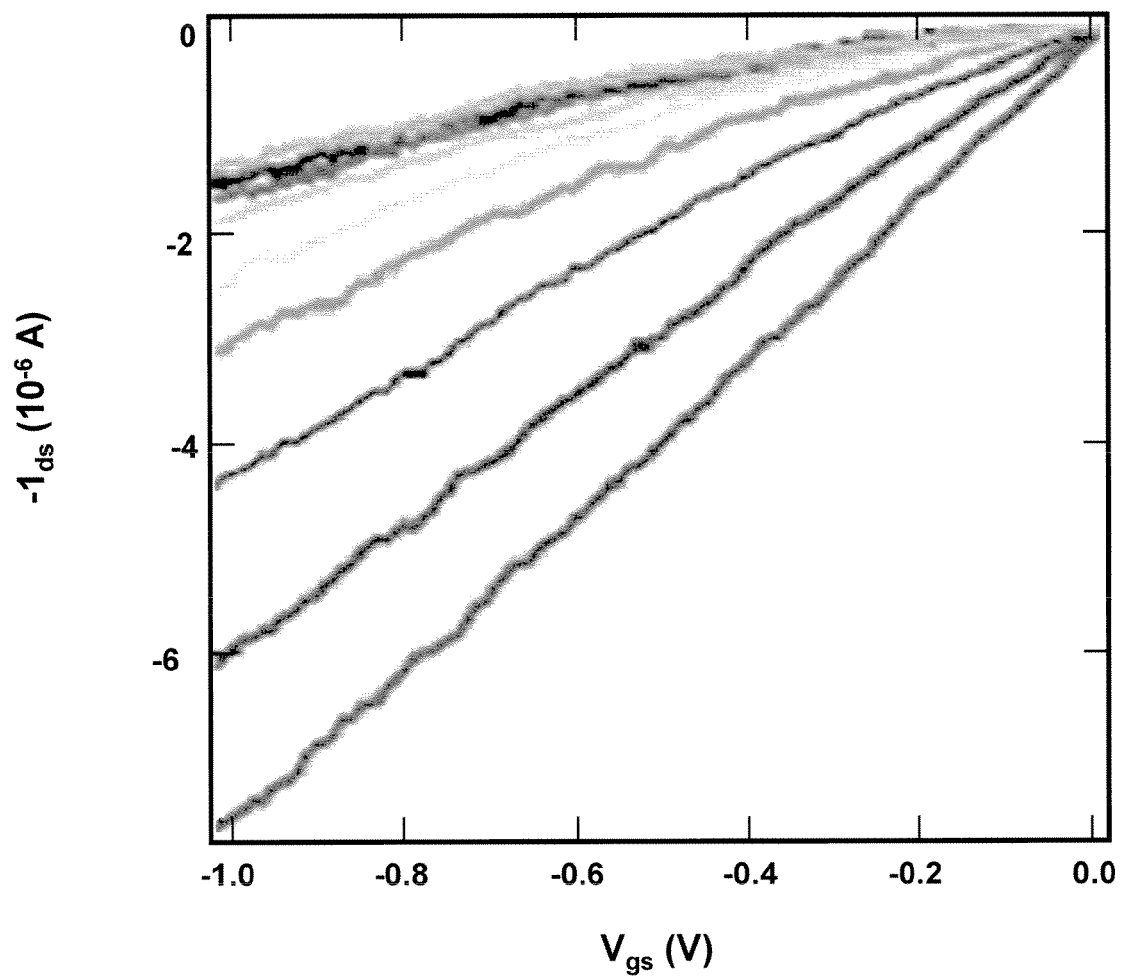
Figure 13:
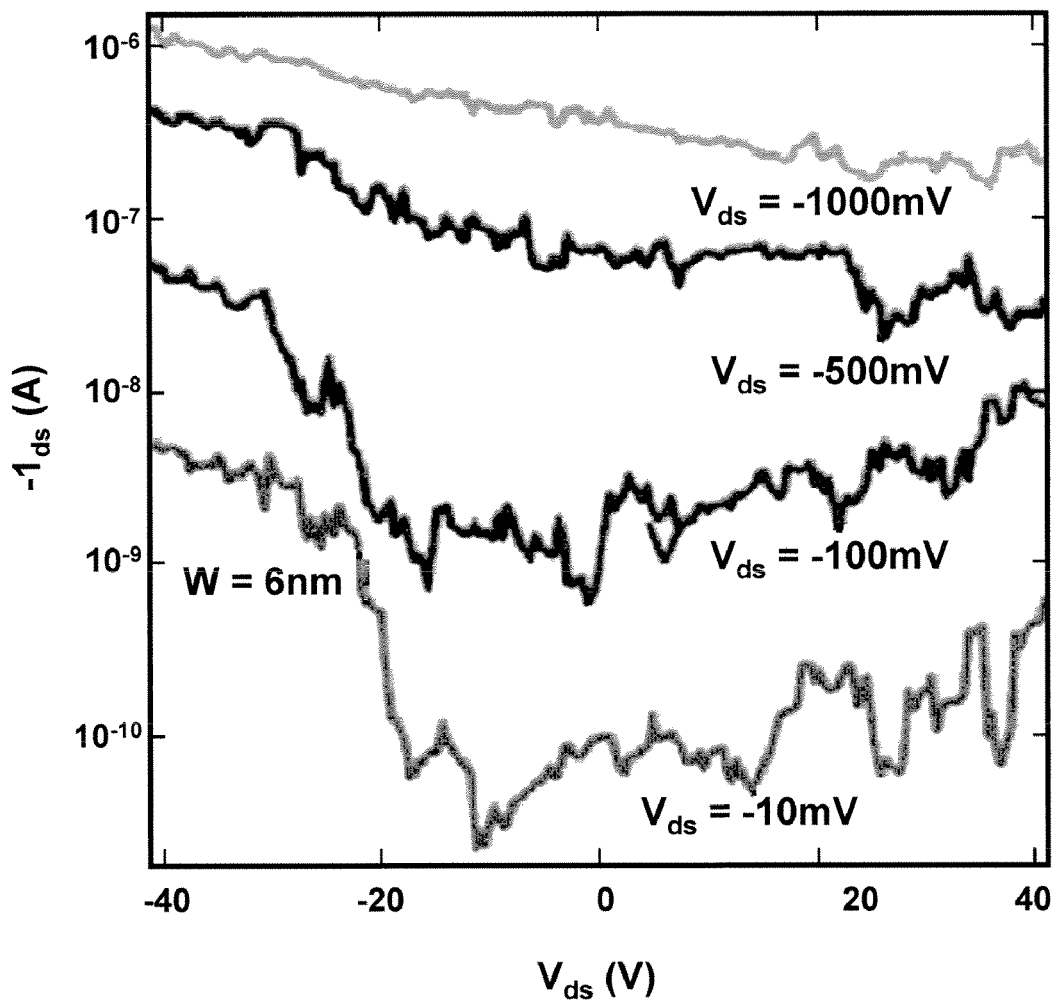
FIG. 13 shows current-voltage $I_{ds}$-$V_{gs}$ curves for a ~6 nm wide GNR device at various bias when probed in air (inset is the AFM image, scale bar is 200 nm). It has an $I_{on}/I_{off}$>102.

Three-terminal devices were fabricated with obtained GNRs (FIG. 12), with Pd as source and drain contacts (channel length, L≈250 nm), a p++ Si back gate and thermally grown 500-nm $SiO_2$ as gate dielectrics. GNRs ≦10 nm in width showed field-effect transistor characteristics with p-doping effects due to the physisorbed $O_2$ from ambient and other species during the treatment steps (FIG. 12C and FIG. 13). A ~7-nm-wide GNR device had an $I_{on}/I_{off}$ ratio of >10 (FIG. 12C) and a ~6-nm-wide GNR device had $I_{on}/I_{off}$>100 (FIG. 13). These GNRs had quantum-confined semiconducting characteristics, rather than those of bulk graphene, with much weaker gate modulation of conductance. The error bar in widths measured by AFM was ±2-3 nm, which led to relatively large uncertainties in the measured widths in the sub-10-nm region. To obtain GNR devices with higher $I_{on}/I_{off}$ values, even narrower GNRs are needed and could be obtained by presently disclosed method by using few-walled CNTs.

Figure 14:
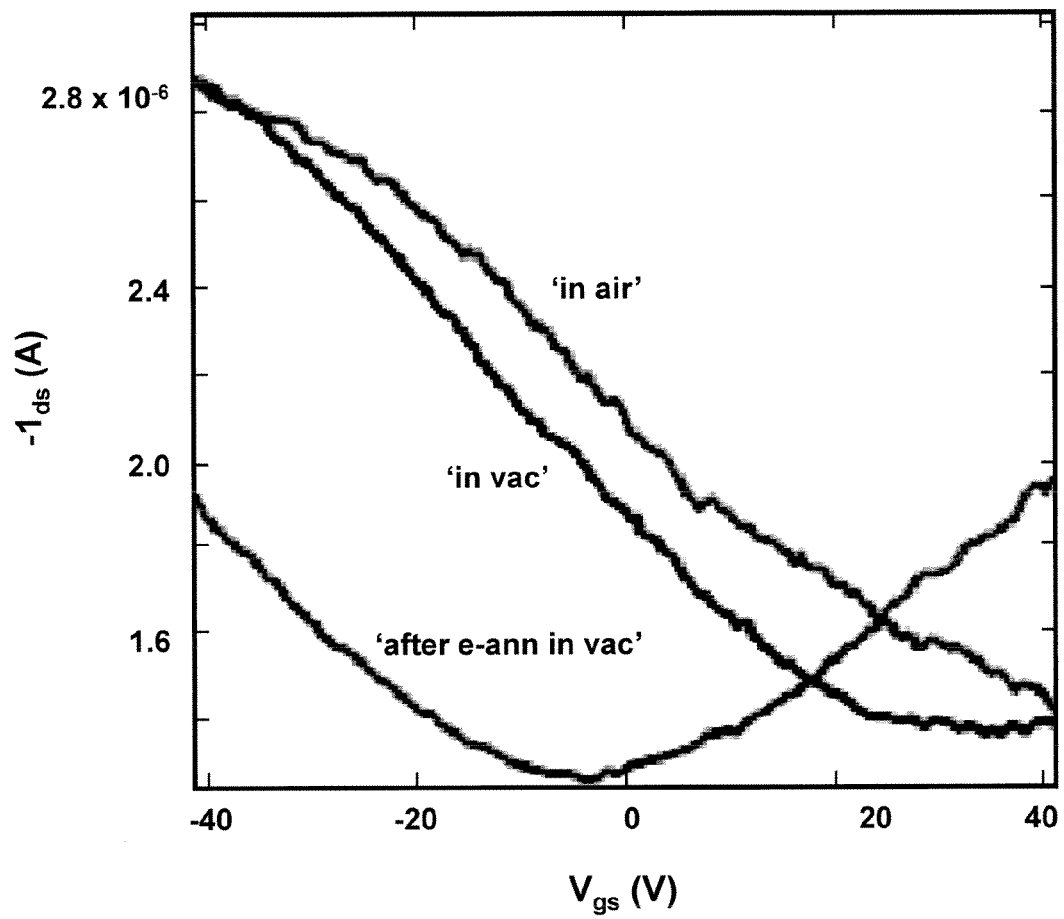
FIG. 14 shows the current-voltage $I_{ds}$-$V_{gs}$ curves of the device shown in FIG. 4B probed in air (top curve), in vacuum (middle curve) and after electrical annealing by applying electrical bias of up to 3V (bottom, concave curve).

The presently disclosed >10-nm-wide GNR devices showed weaker gate dependence (FIG. 12B) owing to smaller band gaps, consistent with lithographically and chemically derived GNRs of similar widths. FIG. 12B shows the transfer characteristics of a ~16-nm-wide GNR device probed in vacuum after electrical annealing by applying a bias of up to 3 V. The GNR exhibited a clear conductance minimum corresponding to the Dirac point at $V_g$≈0 V after electrical annealing by removing physisorbed $O_2$ and other p-doping species (FIG. 14). The 'V'-shaped $I_{ds}$-$V_{gs}$ curve of the GNR device resembles that of bulk graphene, reflecting symmetric hole and electron transports at negative and positive gate voltages, respectively. The resistivity of the devices at the Dirac point for disclosed 10-20-nm-wide GNRs was 10-40 kΩ, similar to lithographically patterned 20-50-nm-wide GNRs. The fact that the resistivity of disclosed GNRs is comparable to that of the lithographically patterned ones suggests a similar quality of GNRs in the 10-20-nm width range. The mobilities of the GNRs made by both methods were also similar and ~10 times lower than those of large two-dimensional graphene sheets, most likely because of edge scattering in the GNRs.

Example 11

Transfer Properties of GNR Devices

The device shown in FIG. 12B was probed in air, in vacuum and after electrical annealing in vacuum (FIG. 14). The Dirac point moved to around $V_{gs}$~0 V after electrical annealing by removing physisorbed $O_2$ and other p-doping sources. The conductance at the Dirac point remained similar before and after electrical annealing. This suggested similar quality/ crystallinity of the GNRs before and after electrical annealing, which also indicated the high quality of the as made ribbons.

Example 12

Preparation of GNRs Array

Aligned CNTs were transferred from quartz substrate to $SiO_2$/Si substrate with prefabricated marker array (formed by EBL and sputtering of 30 nm gold) using the procedures described in Jiao, et al. (Creation of nanostructures with poly (methyl methacrylate)-mediated nanotransfer printing. *J. Am. Chem. Soc.* 2008, 130, 12612-12613). Selected CNTs were located with the aid of markers and characterized using AFM and Raman mapping. After that, a PMMA solution ($M_w$=495 K, 5% in anisole) was spin-coated on the substrate at 3000 round per minute (r.p.m) for 1 min and then baked at 170° C. for 2 hrs on a hot plate. The PMMA film was peeled off together with CNTs and gold markers in 1M KOH solution at 80° C. Then the film was rinsed with water and dried in air. After that, the film was exposed to 5 W Ar plasma for 10 s in a plasma reactive ion etching (RIE) system (MRC Model 55) at a base pressure of 40 mTorr. After etching, the film was printed onto a $SiO_2$/Si substrate. Then PMMA was removed with the vapor of acetone, leaving the unzipped CNTs and gold markers on the target substrate. Finally, the substrate was calcined at 300° C. for 20 min to remove PMMA residue. To improve the quality of GNRs, the calcined GNRs were annealed in $H_2$ at 800° C. for 20 min at a pressure of 1 Torr.

Example 13

Characterization of GNR Arrays from Unzipped Carbon Nanotubes

The starting materials used were dense (1~2 tubes/μm), uniform, highly aligned arrays of long (~1 millimeter) CNTs (diameter: 0.6-3.4 nm; ~80% were SWNTs and ~20% were few-walled CNTs and bundles) grown on ST-cut quartz by CVD [Ding, L.; Yuan, D. N.; Liu, J. Growth of high-density parallel arrays of long single-walled carbon nanotubes on quartz substrates. *J. Am. Chem. Soc.* 2008, 130, 5428 5429]. Markers were used to track specific CNTs through the unzipping process. First as-grown CNT array was transferred from quartz to $SiO_2$/Si substrates with sputtered gold marker array by a nano-transfer printing technique [Jiao, L. Y.; Fan, B.; Xian, X. J.; Wu, Z. Y.; Zhang, J.; Liu, Z. F. Creation of nanostructures with poly(methyl methacrylate)-mediated nanotransfer printing. *J. Am. Chem. Soc.* 2008, 130, 12612-12613]. After that, the CNT array was unzipped following a similar procedure as previously disclosed [Jiao, L. Y.; Zhang, L.; Wang, X. R.; Diankov, G.; Dai, H. J. Narrow graphene nanoribbons from carbon nanotubes. *Nature* 2009, 458, 877-880]. Briefly, a thin film of poly (methyl methacrylate) (PMMA) was spin-coated on top of the CNT array. After baking, CNTs and gold markers were embedded in the PMMA film. The PMMA/CNTs film with gold markers was then peeled off in a KOH solution. The film was then exposed to 5 W Ar plasma for various times. With the protection of PMMA, only the exposed part of tube sidewall was etched by the Ar plasma. After etching, the film was contact-printed to another $SiO_2$/Si substrate. Finally, PMMA film was removed by acetone vapor and followed by calcination at 300° C. for 20 min, leaving the unzipped GNRs and gold markers on the target substrate. The protection of PMMA afforded longitudinal unzipping of CNTs and maintained the alignment of CNTs through the whole process, both were critical to the creation of highly aligned GNR arrays.

AFM characterization found that the resulting GNRs were mostly single-layered with average height of ~1.0 nm (FIG. 15D). The starting CNTs exhibited an average diameter of ~1.4 nm (FIG. 15C). The GNR array maintained the main features of their parent CNT array including high density, good alignment and ultra-long length. The widths of most obtained GNRs fall into the range of 2-8 nm. As shown in the AFM images (FIG. 16A through C), the edges of the GNRs appeared smooth and uniform along the length of GNRs.

Figures 16, 16A, 16B, 16C, 16D, 16E:
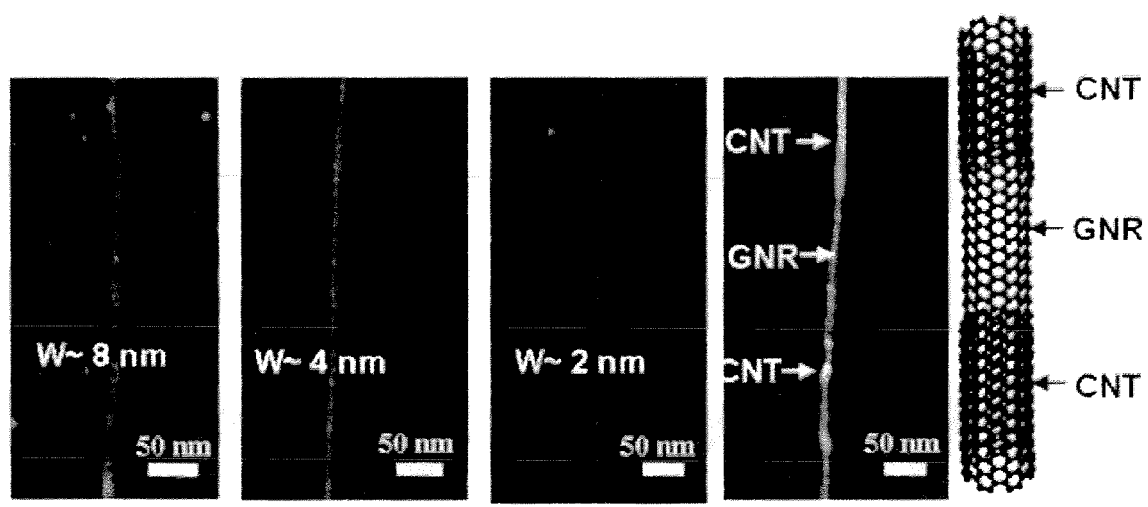
FIG. 16A-E is a series of images representing GNRs prepared from CNTs.

GNR-CNT junction-like structures were also observed in some partially unzipped tubes due to nonuniform etching caused by local deformations of the PMMA film (FIGS. 16D and E). The etching condition was critical to the successful unzipping of SWNTs. The optimized etching condition was found to be 5 W (the lowest stable power that could be used) for 10 s, which was able to unzip the majority of tubes without introducing many breaks. By locating specific CNTs with markers, AFM images and Raman spectra of the same CNTs before and after plasma etching were obtained. AFM images showed that the height of CNTs decreased by ~0.4-0.9 nm after the unzipping process, which indicated that the CNTs were opened up into GNRs by the Ar plasma. It was found that the unzipping efficiency was dependent on the diameter of parent tubes. Small SWNTs (diameter <1.0 nm) were totally etched by plasma and CNTs with a diameter of >2.5 nm were not unzipped by the condition used. All the CNTs with medium diameters (1.0-2.5 nm) were successfully converted into sub-10 nm GNRs. Therefore, the yield of GNRs (~80%) was limited by the diameter distribution of the starting CNTs.

Besides the decrease in height, important changes were also observed in Raman spectra of CNTs after unzipping. Raman spectra of GNRs were collected with Horiba Jobin Yvon LabRAM HR Raman microscope with a 633 nm He—Ne laser excitation (spot size ~1 µm, power ~10 mW). The step size of mapping was 100 nm and the integration time was 10 s at each spot. The Raman spectra of pristine CNTs showed strong G-band and no obvious D-band, which indicated high quality of the starting materials. After the unzipping process, the Raman G-band intensity decreased by ~60% and strong D-band appeared. The appearance of D-band was attributed to the creation of edges that acted as defects responsible for momentum conservation in the double resonance Raman process [Cancado, L. G et al. Influence of the atomic structure on the Raman spectra of graphite edges. *Phys. Rev. Lett.* 2004, 93, 247401; Casiraghi, C et al. Raman spectroscopy of graphene edges. *Nano Lett.* 2009, 9, 1433]. The D-band to G-band ($I_D/I_G$) ratio of the GNRs in the array was ~1.5, much higher than their parent raw tubes (<0.01). The obvious increase of $I_D/I_G$ ratio also confirmed that the CNTs were unzipped by present method. Raman mapping was also performed over individual GNRs and the averaged $I_D/I_G$ ratio of individual GNRs was ~1.5. The averaged $I_D/I_G$ ratio of the sub-10 nm GNRs obtained here was higher than wider GNRs made by unzipping MWNTs by the same approach due to much narrower width (2-8 nm) and proportionally higher defects density at the edges.

Example 14

Device Fabrication

Before making devices, first the dense and long GNR arrays were patterned to within isolated regions using EBL and $O_2$ plasma etching. Then a second EBL was done followed by electron beam deposition of Pd (30 nm) and lift-off to fabricate arrays of source- and drain-electrodes on the GNRs. The channel length of these devices was ~200 nm and the width of source and drain electrodes varied from 500 nm and 5 µm for single- and multiple ribbon devices, respectively. The devices were annealed in Ar at 220° C. for 15 min to improve the contact quality. AFM was then used to identify devices with a single or multiple GNR connection. Electrical characterization of the devices was carried out in air using a semiconductor analyzer (Agilent 4156C).

Example 15

GNR Array and Crossbar Devices

FETs were fabricated on individual and arrays of GNRs, with palladium (Pd) as source/drain (S/D) metal contacts (channel length L ~100 nm), a p++ Si backgate, and 100 nm $SiO_2$ as gate dielectrics. The resulting devices of as-made single GNRs showed higher resistance and lower $I_{on}/I_{off}$ ratio (<$10^2$) at room temperature than sub-10 nm GNRs made by the previous sonochemical approach [Li, et al., Chemically derived, ultrasmooth graphene nanoribbon semiconductors. *Science* 2008, 319, 1229], which suggested high defect density in the as-made GNRs. To improve quality, thermal annealing was carried out aimed at reducing defects on the GNRs generated by the plasma etching process. Thermal annealing in 1 Torr of $H_2$ at 800° C. for 20 min improved the electrical properties of GNRs. The $I_{on}/I_{off}$ ratios and on-state conductance improved. For example, a ~2 nm wide annealed GNR with an $I_{on}/I_{off}$ ratio of ~500 and on-state current of ~500 nA at a bias voltage ($V_{ds}$) of −1V. FET devices were also fabricated on a small array of aligned GNRs. A FET made of 3 aligned GNRs showed an $I_{on}/I_{off}$ ratio of 20 and on-state current of 1.5 µA at $V_{ds}$=−1 V. These results suggested that the sub-10 nm GNRs made by the PMMA-protected plasma unzipping method contained a high defect density, partly due to the ultra-narrowed widths of the ribbons.

The aligned GNRs were explored as building blocks for constructing complex two-dimensional (2D) structures. Crossbar structures potentially useful as logic and memory elements in nanoelectronics were fabricated [Rueckes, et al., Carbon nanotube-based nonvolatile random access memory for molecular computing. *Science* 2000, 289, 94; Melosh et al., Ultrahigh-density nanowire lattices and circuits. *Science* 2003, 300, 112; Fuhrer et al., Crossed nanotube junctions. *Science* 2000, 288, 494] using GNR arrays. Crossbar arrays of GNRs were fabricated by transferring aligned GNR array on top of another array with a rotation of 90°. The two layer of GNR arrays formed well-ordered square mesh structures as evidenced by AFM and Raman G-band images. FIG. 17 shows an AFM image of a GNR-GNR junction. Besides GNR-GNR crossbars, two configurations of GNR-CNT crossbars array were also made by transferring GNRs on top of CNTs or CNTs on top of GNRs (FIG. 18). In the GNR-CNT junction, a ~6 nm wide single layer GNR was placed on the top of a CNT (diameter: ~3.3 nm) and introduced a radial deformation of ~0.3 nm to the underneath CNT at the cross point (FIG. 18), which was also observed in CNT-CNT junctions [Ismach, A & Joselevich, E. Orthogonal self-assembly of carbon nanotube crossbar architectures by simultaneous graphoepitaxy and field-directed growth. *Nano Lett* 2006, 6, 1706]. No obvious deformation was found when the CNTs were on top of GNRs. The successful fabrication of GNR-GNR and GNR-CNT crossbars will make it possible to explore the fundamental properties and possible applications of these junctions.

CONCLUSION

Unzipping of CNSs offers a new way of producing GNRs with controlled structure and quality. The presently disclosed approach is also compatible with semiconductor processing. Progress made in the synthesis, size control, placement and alignment control of CNSs can be exploited to make GNRs in a controlled fashion. CNS s with narrower diameter and chirality distributions can be used to make GNRs with well-defined widths and edge structures. Few-walled CNTs can be used to obtain narrow, sub-10-nm, GNRs with band gaps sufficient for room-temperature transistor applications. Aligned CNS arrays can lead to GNR arrays. Thus, it should be possible to produce large-scale, well-aligned semi-conducting GNRs with controlled structures for practical application in electronics.

Further, well-aligned narrow (<10 nm) GNR arrays have been made from CNT arrays by polymer-protected plasma unzipping. Well-ordered 2D architectures of GNR-GNR and GNR-MWNT crossbars were constructed. The approach presented herein is compatible with semiconductor processing to obtain GNR arrays.

The above specific description is meant to exemplify and illustrate the invention and should not be seen as limiting the scope of the invention, which is defined by the literal and equivalent scope of the appended claims. Any patents or publications mentioned in this specification, including the references cited below are indicative of levels of those skilled in the art to which that patent or publication pertains as of its date and are intended to convey details of the invention which may not be explicitly set out but which would be understood by workers in the field. Such patents or publications are hereby incorporated by reference to the same extent as if each was specifically and individually incorporated by reference, and are intended to be used for the purpose of describing and enabling the method or material referred to.

REFERENCES

1. Li, X. L. et al. Chemically derived, ultrasmooth graphene nanoribbon semiconductors. *Science* 319, 1229-1232 (2008).
2. Wang, X. R. et al. Room-temperature all-semiconducting sub-10-nm graphene nanoribbon field-effect transistors. *Phys. Rev. Lett.* 100, 206803 (2008).
3. Chen, Z. H., Lin, Y. M., Rooks, M. J. & Avouris, P. Graphene nano-ribbon electronics. *Physica E* (Amsterdam) 40, 228-232 (2007).
4. Han, M. Y., Ozyilmaz, B., Zhang, Y. B. & Kim, P. Energy band-gap engineering of graphene nanoribbons. *Phys. Rev. Lett.* 98, 206805 (2007).
5. Cresti, A. et al. Charge transport in disordered graphene-based low dimensional materials. *Nano Res.* 1, 361-394 (2008).
6. Tapaszto, L., Dobrik, G., Lambin, P. & Biro, L. P. Tailoring the atomic structure of graphene nanoribbons by scanning tunneling microscope lithography. *Nature Nanotechnol.* 3, 397-401 (2008).
7. Datta, S. S., Strachan, D. R., Khamis, S. M. & Johnson, A. T. C. Crystallographic etching of few-layer graphene. *Nano Lett.* 8, 1912-1915 (2008).
8. Ci, L. J. et al. Controlled nanocutting of graphene. *Nano Res.* 1, 116-122 (2008).
9. Campos-Delgado, J. et al. Bulk production of a new form of sp2 carbon: crystalline graphene nanoribbons. *Nano Lett.* 8, 2773-2778 (2008).
10. Novoselov, K. S. et al. Electric field effect in atomically thin carbon films. *Science* 306, 666-669 (2004).
11. Zhang, Y. B., Tan, Y. W., Stormer, H. L. & Kim, P. Experimental observation of the quantum Hall effect and Berry's phase in graphene. *Nature* 438, 201-204 (2005).
12. Novoselov, K. S. et al. Two-dimensional gas of massless Dirac fermions in graphene. *Nature* 438, 197-200 (2005).
13. Berger, C. et al. Electronic confinement and coherence in patterned epitaxial graphene. *Science* 312, 1191-1196 (2006).
14. Geim, A. K. & Novoselov, K. S. The rise of graphene. *Nature Mater.* 6, 183-191 (2007).
15. Nakada, K., Fujita, M., Dresselhaus, G. & Dresselhaus, M. S. Edge state in graphene ribbons: nanometer size effect and edge shape dependence. *Phys. Rev. B* 54, 17954-17961 (1996).
16. Barone, V., Hod, O. & Scuseria, G. E. Electronic structure and stability of semiconducting graphene nanoribbons. *Nano Lett.* 6, 2748-2754 (2006).
17. Son, Y. W., Cohen, M. L. & Louie, S. G. Energy gaps in graphene nanoribbons. *Phys. Rev. Lett.* 97, 216803 (2006).
18. Yang, L. et al. Quasiparticle energies and band gaps in graphene nanoribbons. *Phys. Rev. Lett.* 99, 186801 (2007).
19. Dai, H. J. Carbon nanotubes: opportunities and challenges. *Surf Sci.* 500, 218-241 (2002).
20. Jorio, A., Dresselhaus, M. S. & Dresselhaus, G. Carbon Nanotubes: Advanced Topics in the Synthesis, Structure, Properties and Applications. (Springer, 2008).
21. Jiao, L. Y. et al. Creation of nanostructures with poly(methyl methacrylate)-mediated nanotransfer printing. *J. Am. Chem. Soc.* 130, 12612-12613 (2008).
22. Lin, Y. M. & Avouris, P. Strong suppression of electrical noise in bilayer graphene nanodevices. *Nano Lett.* 8, 2119-2125 (2008).
23. Jiao, L. Y., Xian, X. J. & Liu, Z. F. Manipulation of ultralong single-walled carbon nanotubes at macroscale. *J. Phys. Chem. C* 112, 9963-9965 (2008).
24. Ferrari, A. C. et al. Raman spectrum of graphene and graphene layers. *Phys. Rev. Lett.* 97, 187401 (2006).
25. Graf, D. et al. Spatially resolved Raman spectroscopy of single- and few-layer graphene. *Nano Lett.* 7, 238-242 (2007).
26. Ni, Z. H., Wang, Y. Y., Yu, T. & Shen, Z. X. Raman spectroscopy and imaging of graphene. *Nano Res.* 1, 273-291 (2008).
27. Winters, H. F., Coburn, J. W. & Chuang, T. J. Surface processes in plasma-assisted etching environments. *J. Vac. Sci. Technol. B* 1, 469-480 (1983).
28. Moser, J., Barreiro, A. & Bachtoldb, A. Current-induced cleaning of graphene. *Appl. Phys. Lett.* 91, 163513 (2007).
29. Lin, Y. M., Perebeinos, V., Chen, Z. H. & Avouris, P. Electrical observation of subband formation in graphene nanoribbons. *Phys. Rev. B* 78, 161409 (2008).
30. Ding, L.; Yuan, D. N.; Liu, J. Growth of high-density parallel arrays of long single-walled carbon nanotubes on quartz substrates. *J. Am. Chem. Soc.* 2008, 130, 5428 5429.
31. Jiao, L. Y.; Fan, B.; Xian, X. J.; Wu, Z. Y.; Zhang, J.; Liu, Z. F. Creation of nanostructures with poly(methyl methacrylate)-mediated nanotransfer printing. *J. Am. Chem. Soc.* 2008, 130, 12612-12613.
32. Cancado, L. G.; Pimenta, M. A.; Neves, B. R. A.; Dantas, M. S. S; Jorio, A. Influence of the atomic structure on the Raman spectra of graphite edges. *Phys. Rev. Lett.* 2004, 93, 247401.
33. Casiraghi, C.; Hartschuh, A.; Qian, H.; Piscanec, S.; Georgi, C.; Fasoli, A.; Novoselov, K. S.; Basko, D. M.; Ferrari, A. C. Raman spectroscopy of graphene edges. *Nano Lett.* 2009, 9, 1433-1441.
34. Rueckes, T.; Kim, K.; Joselevich, E.; Tseng, G. Y.; Cheung, C. L.; Lieber, C. M. Carbon nanotube-based nonvolatile random access memory for molecular computing. *Science* 2000, 289, 94-97.
35. Melosh, N. A.; Boukai, A.; Diana, F.; Gerardot, B.; Badolato, A.; Petroff, P. M.; Heath, J. R. Ultrahigh-density nanowire lattices and circuits. *Science* 2003, 300, 112-115.

36. Fuhrer, M. S.; Nygard, J.; Shih, L.; Forero, M.; Yoon, Y. G.; Mazzoni, M. S. C.; Choi, H. J.; Ihm, J.; Louie, S. G.; Zettl, A.; McEuen, P. L. Crossed nanotube junctions. *Science* 2000, 288, 494-497.

37. Ismach, A.; Joselevich, E. Orthogonal self-assembly of carbon nanotube crossbar architectures by simultaneous graphoepitaxy and field-directed growth. *Nano Lett* 2006, 6, 1706-1710.

What is claimed is:

1. A method for producing a graphene nanoribbon by opening a closed carbon nanostructure ("CNS"), comprising the steps of:
    (a) depositing a CNS onto a first substrate;
    (b) applying a protective coating to cover the CNS on the first substrate;
    (c) obtaining an exposed strip along the CNS essentially free of protective coating;
    (d) treating said exposed strip along the CNS to remove outer wall bonds in said exposed strip to produce an etched CNS; and
    (e) recovering the etched CNS from the protective coating to produce the graphene nanoribbon from one or more outer walls having bonds removed.

2. The method of claim 1 wherein the step of obtaining an exposed strip comprises separating the CNS from the substrate.

3. The method of claim 1 wherein said CNS is selected from the group consisting of MWNT, SWNT, spherical fullerenes, carbon nano-onions, carbon nanohorns, carbon helicoidal tubes, and carbon toroidal structures.

4. The method of claim 2 wherein said CNS is an MWNT.

5. The method of claim 1 wherein said graphene nanoribbon has between one and four layers.

6. The method of claim 1 wherein said graphene nanoribbon has ultrasmooth edges.

7. The method of claim 1 wherein graphene nanoribbon has a width between about 10 nm and 20 nm.

8. The method of claim 1 wherein said depositing a CNS onto a substrate comprises applying a dispersed mixture of CNS onto a substrate.

9. The method of claim 1 wherein said protective coating is a polymer.

10. The method of claim 9 wherein said polymer is an acrylate selected from the group consisting of polyacrylamides, polycarbonates, silicone, or co- and terpolymers of acrylates.

11. The method of claim 10 wherein the polymer is poly (methyl methacrylate).

12. The method of claim 1 wherein said treating said exposed strip comprises contacting the exposed strip with a plasma.

13. The method of claim 12 wherein the plasma is argon plasma.

14. The method of claim 12 wherein the plasma is a low power plasma.

15. The method of claim 1 further comprising the step of treating said exposed strip for longer times to produce fewer layer graphene nanoribbons.

16. The method of claim 1 further comprising the step of removing the CNS, along with the protective coating, from the first substrate and applying it to a second substrate prior to said treating.

17. A method for producing a graphene nanoribbon device comprising the steps of:
    (a) depositing a closed graphene nanostructure (hereinafter "CNS") onto a first substrate;
    (b) applying a protective coating to cover the CNS on the first substrate;
    (c) separating the CNS from the substrate leaving an exposed strip along the CNS essentially free of protective coating;
    (d) treating, optionally on a second substrate, said exposed strip to remove outer wall bonds in said exposed strip to produce an etched CNS;
    (e) recovering the etched CNS from the protective coating to produce the graphene nanoribbon from one or more outer walls having bonds removed; and
    (f) applying a recovered graphene nanoribbon to an electronic device.

18. The method of claim 17 wherein the step of applying the recovered graphene nanoribbon to lengthwise on a gate material between a source electrode at one end portion and a drain electrode at an opposite end portion.

19. The method of claim 16 further comprising the step of fabricating a field effect transistor.

20. The method of claim 16 wherein resistivity of said graphene nanoribbon is between 10 and 40 k$\Omega$.

21. A method of preparing a graphene nanoribbon array, comprising the steps of:
    (a) depositing a plurality of closed graphene nanostructures ("CNSs") onto a first substrate in a predetermined pattern;
    (b) applying a protective coating to cover the plurality of CNSs on the first substrate;
    (c) separating the CNSs from the substrate leaving an exposed strip essentially free of protective coating and the CNSs embedded in said protective coating in said predetermined pattern;
    (d) treating, optionally on a second substrate, said exposed strip to remove outer wall bonds in said exposed strip to produce etched CNSs embedded in said protective coating in said predetermined pattern; and
    (e) transferring said etched CNSs embedded in said protective coating in said predetermined pattern to a third substrate in graphene nanoribbon array.

22. The method of claim 21 further comprising the step of forming an electronic device on said third substrate.

23. The method of claim 21 wherein said CNS is selected from the group consisting of SWNT and MWNT.

24. The method of claim 21 wherein said third substrate comprises a plurality of silicon back gates, one silicon back-gate in contact with one graphene nanoribbon.

* * * * *

UNITED STATES PATENT AND TRADEMARK OFFICE
CERTIFICATE OF CORRECTION

| | | |
|---|---|---|
| PATENT NO. | : 8,236,626 B2 | Page 1 of 1 |
| APPLICATION NO. | : 12/760998 | |
| DATED | : August 7, 2012 | |
| INVENTOR(S) | : Hongjie Dai et al. | |

It is certified that error appears in the above-identified patent and that said Letters Patent is hereby corrected as shown below:

On the Title Page, Item (75), Inventors, "Hongie Dai" should read --Hongjie Dai--.

Signed and Sealed this
Sixteenth Day of December, 2014

Michelle K. Lee
*Deputy Director of the United States Patent and Trademark Office*